under a Patent

United States Patent
Shimizu et al.

(10) Patent No.: US 11,489,270 B2
(45) Date of Patent: Nov. 1, 2022

(54) TERMINAL BLOCK AND CONDUCTIVE PATH

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hiroshi Shimizu, Mie (JP); Ryoya Okamoto, Mie (JP); Hitoshi Takeda, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 94 days.

(21) Appl. No.: 17/254,512

(22) PCT Filed: Jun. 21, 2019

(86) PCT No.: PCT/JP2019/024638
§ 371 (c)(1),
(2) Date: Dec. 21, 2020

(87) PCT Pub. No.: WO2020/012914
PCT Pub. Date: Jan. 16, 2020

(65) Prior Publication Data
US 2021/0218163 A1   Jul. 15, 2021

(30) Foreign Application Priority Data
Jul. 9, 2018   (JP) .............................. JP2018-130060

(51) Int. Cl.
H01R 9/24   (2006.01)
H01R 9/22   (2006.01)

(52) U.S. Cl.
CPC .............. H01R 9/24 (2013.01); H01R 9/223 (2013.01)

(58) Field of Classification Search
CPC . H01R 9/22; H01R 9/223; H01R 9/24; H01R 9/2416; H01R 9/2458
(Continued)

(56) References Cited

U.S. PATENT DOCUMENTS 3,466,745 A * 9/1969 Stopp ................. H01B 7/00
174/117 FF
3,956,574 A * 5/1976 Weimer .............. H02G 5/06
174/68.2
(Continued)

FOREIGN PATENT DOCUMENTS

| JP | 2013-037988 | 2/2013 |
| JP | 2013-219110 | 10/2013 |
| JP | 2016-024939 | 2/2016 |

OTHER PUBLICATIONS

Official Communication issued in International Bureau of WIPO Patent Application No. PCT/JP2019/024638, dated Sep. 10, 2019, along with an English translation thereof.

*Primary Examiner* — William H. Mayo, III
(74) *Attorney, Agent, or Firm* — Greenblum & Bernstein, P.L.C.

(57) ABSTRACT

A terminal block includes a lower bus bar and an upper bus bar that overlap each other at overlap portions and an insulating middle cover disposed between the overlap portion of the lower bus bar and the overlap portion of the upper bus bar. The lower bus bar and the upper bus bar are provided with their respective ones of first to fourth terminals exposed from the middle cover, at positions different
(Continued)

from the overlap portions and the first to fourth terminals are disposed at positions radially spaced apart from the overlap portions.

10 Claims, 22 Drawing Sheets

(58) Field of Classification Search
USPC ........................ 174/50, 50.6, 50.51, 51, 68.2
See application file for complete search history.

(56) References Cited

U.S. PATENT DOCUMENTS

| | | | | |
|---|---|---|---|---|
| 4,945,188 A | * | 7/1990 | Jackson | ................ H02G 5/002 |
| | | | | 174/70 B |
| 9,241,428 B1 | * | 1/2016 | Doo | ..................... H05K 7/1432 |
| 9,508,464 B2 | | 11/2016 | Nakayama | |
| 2014/0158396 A1 | * | 6/2014 | Nakayama | .......... H01M 50/572 |
| | | | | 174/138 F |

* cited by examiner

FIG. 14
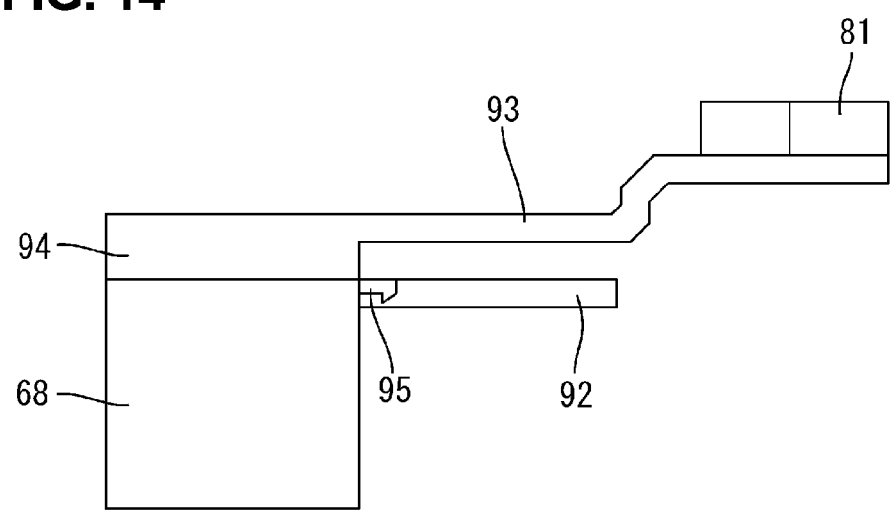
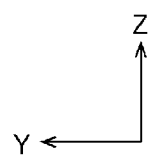

TERMINAL BLOCK AND CONDUCTIVE PATH

TECHNICAL FIELD

The technique disclosed in the present specification relates to a terminal block including bus bars, and a conductive path including the terminal block.

BACKGROUND ART

Conventionally, the conductive path described in JP 2013-37988A is known as a conductive path using a bus bar made of a metal. For this conductive path, a bus bar including terminal portions on opposite ends thereof is disposed inside a cover made of an insulating synthetic resin. The terminal portions that are exposed from the cover are configured to be connected to external circuits. In the conventional technique, the electrode terminals of cells are disclosed as the external circuits.

CITATION LIST

Patent Document

Patent Document 1: JP 2013-37988A

SUMMARY OF INVENTION

Technical Problem

According to the above-described technique, one bus bar is disposed inside one cover, and it is therefore difficult to achieve a complex routing structure by using a bus bar. For example, when electrically connecting ends of a plurality of conductive paths to each other, it is necessary to provide a plurality of conductive paths in which a bus bar is disposed in each cover, and therefore a large routing space is required.

The technique disclosed in the present specification has been completed based on the above-described circumstances, and an object thereof is to provide a technique for reducing the routing space of a conductive path for which bus bars are used.

Solution to Problem

A technique disclosed in the present specification relates to a terminal block including: a plurality of bus bars that include overlap portions and that overlap each other at the overlap portions; and an insulating middle cover disposed between the overlap portions of the plurality of bus bars, wherein each of the plurality of bus bars is provided with a plurality of terminals exposed from the middle cover, at positions different from the overlap portions, and the plurality of terminals are disposed at positions radially spaced apart from the overlap portions.

According to the above-described configuration, the plurality of bus bars are insulated by the middle cover, and it is thus possible to reduce the routing space as compared with a case where a plurality of conductive paths is used in which one bus bar is disposed in each cover.

The following embodiments are preferable as embodiments of the technique disclosed in the present specification.

An insulating outer cover is mounted to one of the plurality of bus bars that is located outermost in an overlapping direction in which the overlap portions are overlapped.

According to the above-described configuration, one of the plurality of overlapped bus bars that is disposed at the outermost end is insulated by the outer cover. Accordingly, it is possible to suppress the occurrence of a short circuit caused by a foreign object coming into contact with the bus bar.

The middle cover is formed as a single piece with at least one side of the outer cover via a hinge having flexibility.

According to the above-described configuration, the middle cover and the outer cover can be formed as a single piece, and it is thus possible to reduce the number of components. In addition, the middle cover can be overlapped with the bus bar by a simple operation of flexibly deforming the hinge, and it is thus possible to increase the efficiency of the manufacturing operation of the terminal block.

The middle cover is coupled to at least one side of the outer cover by a coupling portion.

According to the above-described configuration, the middle cover and the outer cover are formed as a single piece, and it is thus possible to reduce the number of components.

A conductive path according to a technique disclosed in the present specification includes: the above-described terminal block; a plurality of routing conductive paths disposed on one routing path; and a plurality of lead-out conductive paths disposed in locations different from the one routing path, wherein the plurality of routing conductive paths are connected to the plurality of lead-out conductive paths via the terminal block.

According to the above-described configuration, one routing path can be shared by the plurality of routing conductive paths, and it is thus possible to increase the routing space efficiency of the conductive path as compared with a case where a plurality of conductive paths are disposed on routing paths that are different from each other.

Advantageous Effects of Invention

According to the technique disclosed in the present specification, it is possible to reduce the routing space of a conductive path for which bus bars are used.

BRIEF DESCRIPTION OF DRAWINGS

FIG. 14 is a side view showing the upper cover that is formed as a single piece with the middle cover.

DESCRIPTION OF EMBODIMENTS

Embodiment 1

Figure 1:
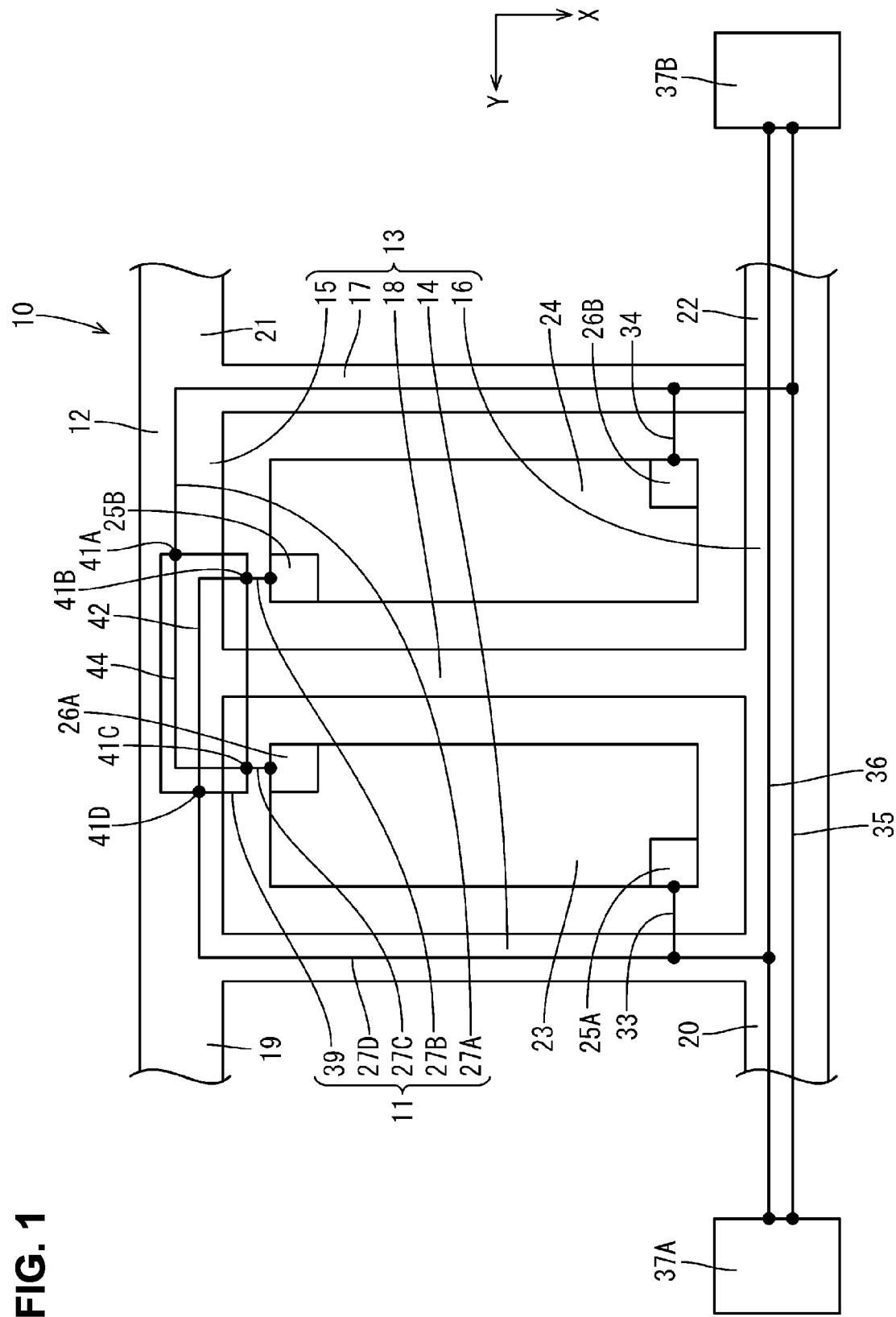
FIG. 1 is a block diagram schematically showing a conductive path according to Embodiment 1.

Embodiment 1 of the technique disclosed in the present specification will be described with reference to FIGS. 1 to 10. The present embodiment is an embodiment in which the technique disclosed in the present specification is applied to a conductive path 11 disposed in a vehicle 10. The following description will be given assuming that the Z direction is the upward direction, the Y direction is the forward direction, and the X direction is the leftward direction. For a plurality of identical members, reference numerals may be assigned to some of the members, and reference numerals may be omitted for the other members.

Vehicle Body 12

As shown in FIG. 1, a roof frame 13 made of a metal is disposed on the roof of a vehicle body 12 of the vehicle 10. The roof frame 13 has a substantially rectangular shape as viewed from above (an example of an overlapping direction). The roof frame 13 includes a front member 14 disposed on the front side and extending in the left-right direction, a right side member 15 extending rearward from a right end portion of the front member 14, a left side member 16 extending rearward from a left end portion of the front member 14, a rear member 17 that couples a rear end portion of the right side member 15 and a rear end portion of the left side member 16, and a cross member 18 that couples a portion in the vicinity of the center of the right side member 15 and a portion in the vicinity of the center of the left side member 16 in the front-rear direction.

A right front pillar 19 extending obliquely downwardly forward is provided at a right end portion of the front member 14, and a left front pillar 20 extending obliquely downwardly forward is provided at a left end portion of the front member 14. A right rear pillar 21 extending obliquely downwardly rearward is provided at a right end portion of the rear member 17, and a left rear pillar 22 extending obliquely downwardly rearward is provided at a left end portion of the rear member 17.

On the roof of the vehicle body 12, a front solar panel 23 is disposed within a region surrounded by the front member 14, the right side member 15, the cross member 18, and the left side member 16, and a rear solar panel 24 is disposed within a region surrounded by the cross member 18, the right side member 15, the rear member 17, and the left side member 16.

Solar Panel

The front solar panel 23 and the rear solar panel 24 each include a plurality of power generating elements (not shown) that convert light energy into electric power. The plurality of power generating elements included in each of the front solar panel 23 and the rear solar panel 24 are connected in series or in parallel.

Figure 2:
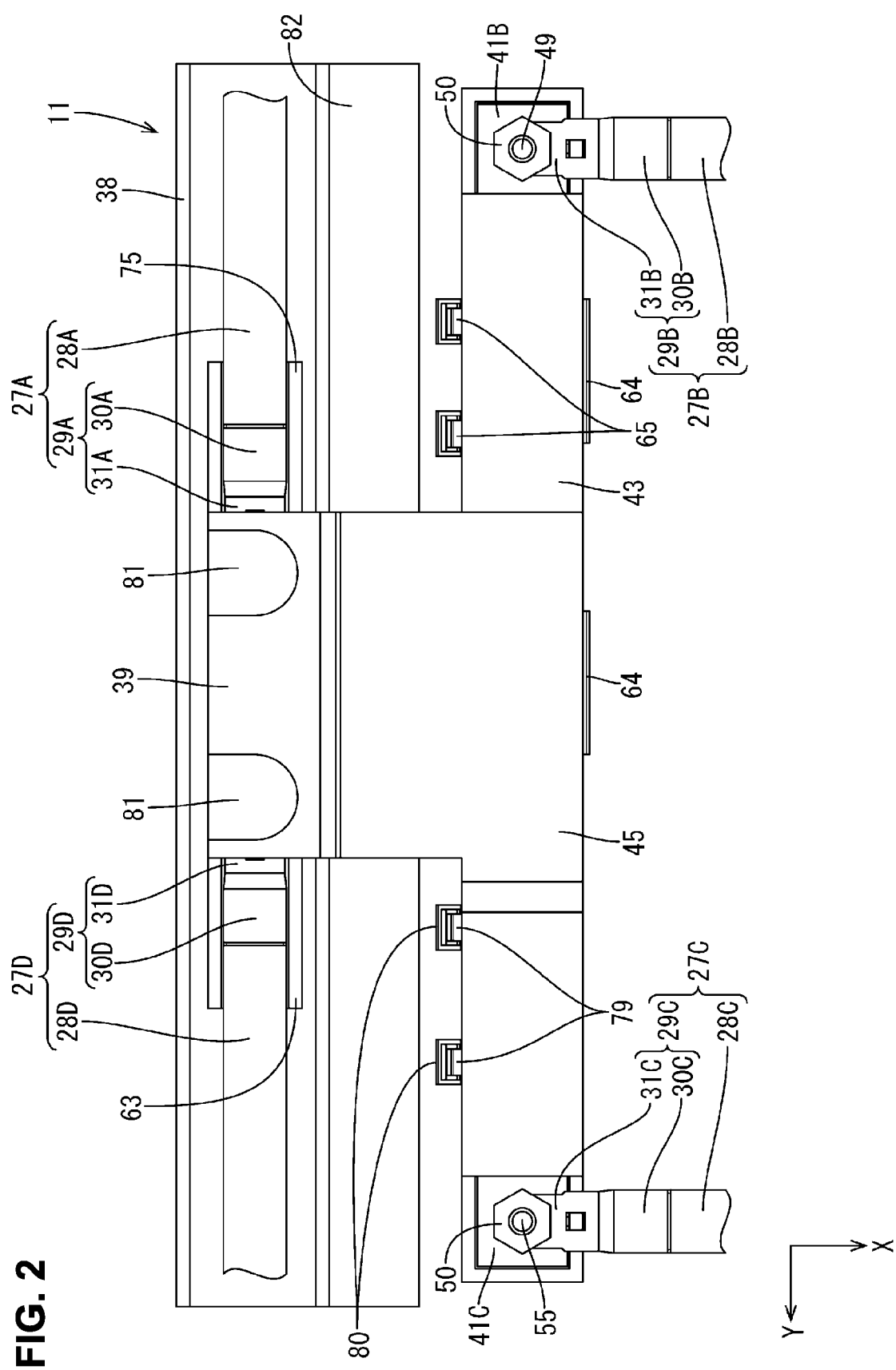
FIG. 2 is a partially enlarged plan view showing the conductive path and a terminal block.

A negative electrode terminal 25A is provided on the left front corner of the front solar panel 23. A positive electrode terminal 26A is provided on the right rear corner of the front solar panel 23. A third conductive path 27C (an example of a lead-out conductive path) is connected to the positive electrode terminal 26A. As shown in FIG. 2, the third conductive path 27C includes a coated wire 28C, and a metal terminal fitting 29C connected to a portion of an end of the coated wire 28C that is disposed on the right side member 15. The terminal fitting 29C includes a wire connection portion 30C connected to the coated wire 28C by a known method such as crimping or welding, and a flat plate portion 31C that is continuous with the wire connection portion 30C. The flat plate portion 31C has a through hole (not shown) thorough which a stud bolt 55, which will be describe later, is passed.

A positive electrode terminal 26B is provided on the left rear corner of the rear solar panel 24. A negative electrode terminal 25B is provided on the right front corner of the rear solar panel 24. A second conductive path 27B (an example of the lead-out conductive path) is connected to the negative electrode terminal 25B. As shown in FIG. 2, the second conductive path 27B includes a coated wire 28B, and a metal terminal fitting 29B connected to a portion of an end of the coated wire 28B that is disposed on the right side member 15. The terminal fitting 29B includes a wire connection portion 30B connected to the coated wire 28B by a known method such as crimping or welding, and a flat plate portion 31B that is continuous with the wire connection portion 30B. The flat plate portion 31B has a through hole (not shown) through which a stud bolt 49 is passed.

Fourth Conductive Path 27D

A fourth conductive path 27D (an example of the routing conductive path) is routed on the front member 14 in a region of the right side member 15 that is located forward of the cross member 18. The fourth conductive path 27D is routed in a shape that is bent in a substantially L-shape as viewed from above. As shown in FIG. 2, the fourth conductive path 27D includes a coated wire 28D, and a metal terminal fitting 29D connected to a portion of an end of the coated wire 28D that is disposed on the right side member 15. The terminal fitting 29D includes a wire connection portion 30D connected to the coated wire 28D by a known method such as crimping or welding, and a flat plate portion 31D that is continuous with the wire connection portion 30D. The flat plate portion 31D has a through hole (not shown) through which a bolt 32D is passed. As the fourth conductive path 27D, a stripped wire having the terminal fitting 29D connected to an end thereof may be used, or a bus bar may be used.

The fourth conductive path 27D is electrically connected to the negative electrode terminal 25A of the front solar panel 23 at a position of the front member 14 that is located toward the left end thereof via a negative electrode branch path 33. As the negative electrode branch path 33, a wire such as a stripped wire or a coated wire may be used, or a bus bar may be used.

First Conductive Path 27A

A first conductive path 27A (an example of the routing conductive path) is routed at a position of the right side member 15 that is located rearward of the cross member 18, and on the rear member 17. The first conductive path 27A is routed in a shape that is bent in a substantially L-shape as viewed from above. As shown in FIG. 2, the first conductive path 27A includes a coated wire 28A, and a metal terminal fitting 29A connected to a portion of an end of the coated wire 28A that is disposed on the right side member 15. The terminal fitting 29A includes a wire connection portion 30A connected to the coated wire 28A by a known method such as crimping or welding, and a flat plate portion 31A that is continuous with the wire connection portion 30A. The flat plate portion 31A has a through hole (not shown) through which a bolt 32A is passed. As the first conductive path 27A, a stripped wire having the terminal fitting 29A connected to an end thereof may be used, or a bus bar may be used.

The first conductive path 27A is electrically connected to the positive electrode terminal 26B of the rear solar panel 24 at a position of the rear member 17 that is located toward the left end thereof via a positive electrode branch path 34. As the positive electrode branch path 34, a wire such as a stripped wire or a coated wire may be used, or a bus bar may be used.

A positive electrode conductive path 35 and a negative electrode conductive path 36 are routed on the left front pillar 20, the left side member 16, and the left rear pillar 22 so as to extend in the front-rear direction in an electrically insulated state. As the positive electrode conductive path 35 and the negative electrode conductive path 36, a wire such as a stripped wire or a coated wire may be used, or a bus bar may be used.

The positive electrode conductive path 35 and the first conductive path 27A are electrically connected to each other in the vicinity of a portion where a left end portion of the rear member 17 and a rear end portion of the left side member 16 are coupled. Also, the negative electrode conductive path 36 and the fourth conductive path 27D are electrically connected to each other in the vicinity of a portion where a left end portion of the front member 14 and a front end portion of the left side member 16 are coupled.

As shown in FIG. 1, the positive electrode conductive path 35 and the negative electrode conductive path 36 are routed from the left front pillar 20 to the front of the vehicle body 12. The positive electrode conductive path 35 and the negative electrode conductive path 36 that are routed to the front of the vehicle body 12 are electrically connected to a front electric component 37A disposed in the front half of the vehicle body 12. On the other hand, the positive electrode conductive path 35 and the negative electrode conductive path 36 are routed from the left rear pillar 22 also to the rear of the vehicle body 12. The positive electrode conductive path 35 and the negative electrode conductive path 36 that are routed to the rear of the vehicle body 12 are electrically connected to a rear electric component 37B disposed in the rear half of the vehicle body 12. The front electric component 37A and the rear electric component 37B are connected in parallel by the positive electrode conductive path 35 and the negative electrode conductive path 36. As the front electric component 37A and the rear electric component 37B, any electric component such as a storage battery, a capacitor, an inverter, or a motor may be selected as appropriate where necessary.

As shown in FIG. 2, in the present embodiment, the flat plate portion 31A of the first conductive path 27A, the flat plate portion 31B of the second conductive path 27B, the flat plate portion 31C of the third conductive path 27C, and the flat plate portion 31D of the fourth conductive path 27D are disposed at intervals in the clockwise direction as viewed from above.

Note that the flat plate portions 31A, 31B, 31C, and 31D of the first to fourth conductive paths 27A, 27B, 27C, and 27D may be disposed on one plane, or need not be disposed on any plane. In addition, the arrangement of the first conductive path 27A, the second conductive path 27B, the third conductive path 27C, and the fourth conductive path 27D is not particularly limited; they may be disposed so as to be aligned in the clockwise direction as viewed from above, or need not be disposed so as to be aligned in the clockwise direction as viewed from above.

Routing Path 38

A routing path 38 extending in the front-rear direction is disposed on the right side member 15. As shown in FIG. 2, the routing path 38 is made of a metal, and is formed in the shape of an upwardly open groove. As the metal member for forming the routing path 38, any metal such as aluminum, an aluminum alloy, copper, a copper alloy, or stainless steel can be selected as appropriate. In the present embodiment, aluminum or an aluminum alloy is used for the routing path 38. The routing path 38 can be formed by any method such as extrusion molding, die-cast molding, or press molding. In the present embodiment, the routing path 38 is formed in a predetermined shape by extrusion molding.

The routing path 38 is attached to a bottom wall of the right side member 15 using a bracket (not shown). The routing path 38 is held by the bracket so as to be slightly raised upward from the bottom wall of the right side member 15. Accordingly, the flat plate portion 31B of the second conductive path 27B and the flat plate portion 31C of the third conductive path 27C are disposed on the bottom wall of the right side member 15, and the flat plate portion 31A of the first conductive path 27A and the flat plate portion 31D of the fourth conductive path 27D are disposed on the routing path 38, which is located above the bottom wall of the right side member 15. Thus, the height position in the up-down direction of the flat plate portion 31A of the first conductive path 27A and the flat plate portion 31D of the fourth conductive path 27D is different from the height position in the up-down direction of the flat plate portion 31B of the second conductive path 27B and the flat plate portion 31C of the third conductive path 27C.

The fourth conductive path 27D is disposed in a region of the routing path 38 that is located forward of a terminal block 39, which will be described later, and the first conductive path 27A is disposed in a region of the routing path 38 that is located rearward of the terminal block 39. In other words, one routing path 38 is shared by the fourth conductive path 27D and the first conductive path 27A, with the terminal block 39 as a boundary.

A flange 82 protruding leftward and extending in the front-rear direction is formed at the left edge of the routing path 38.

Terminal Block 39

A terminal block 39 that is connected to the flat plate portion 31A of the first conductive path 27A, the flat plate portion 31B of the second conductive path 27B, the flat plate portion 31C of the third conductive path 27C, and the flat plate portion 31D of the fourth conductive path 27D is disposed at the connection portion between the right side member 15 and the cross member 18.

Figure 10:
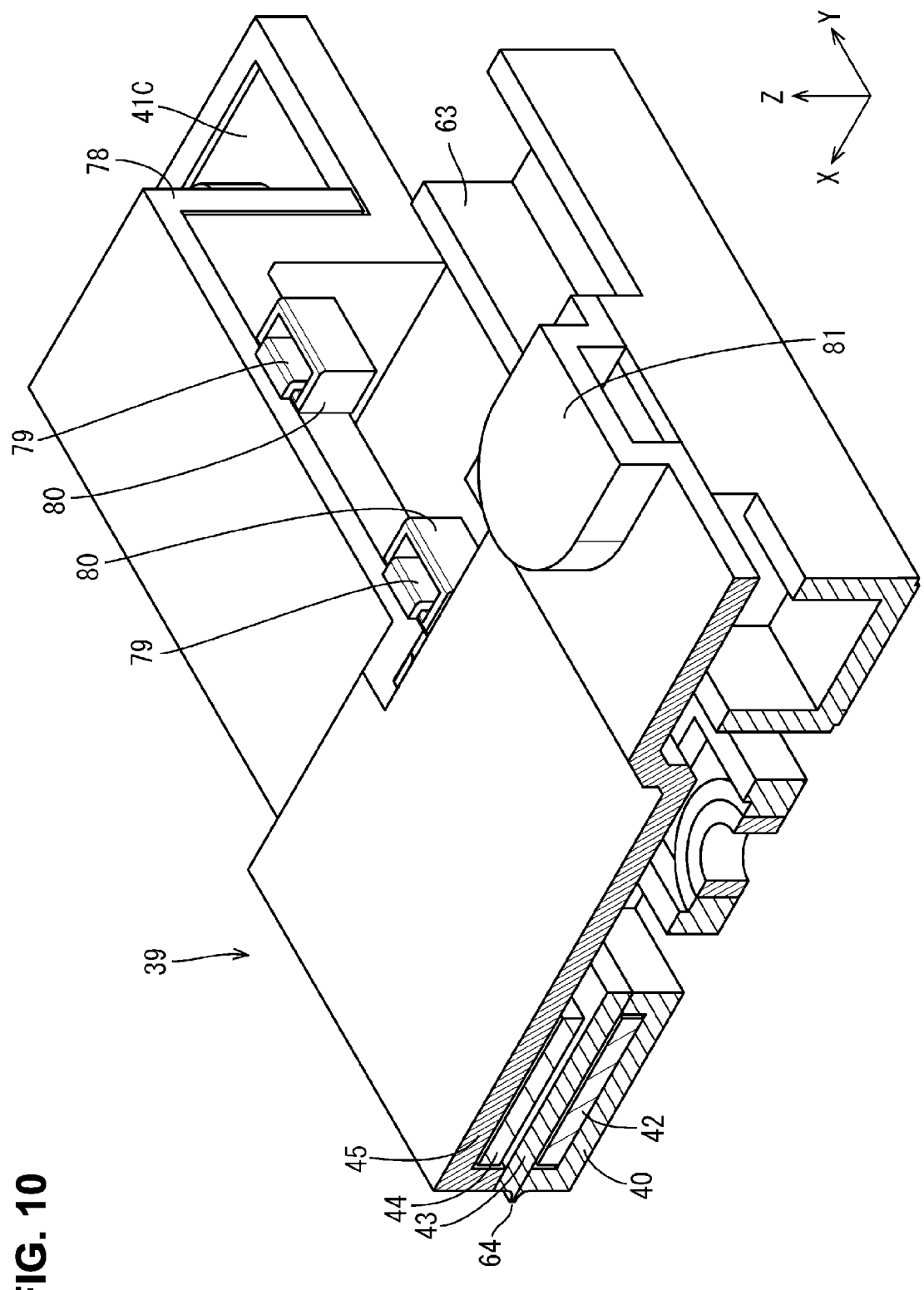
FIG. 10 is a partially enlarged cross-sectional view showing a state in which the lower bus bar and the upper bus bar are insulated by the middle cover.

As shown in FIG. 10, the terminal block 39 includes a lower cover 40 (an example of an outer cover), a lower bus bar 42 (an example of a bus bar) configured to be overlapped with the lower cover 40 and including a second terminal 41B (an example of a terminal) and a fourth terminal 41D (an example of the terminal), a middle cover 43 configured to be overlapped with the lower bus bar 42, an upper bus bar 44 (an example of the bus bar) configured to be overlapped with the middle cover 43 and including a first terminal 41A (an example of the terminal) and a third terminal 41C (an example of the terminal), and an upper cover 45 (an example of the outer cover) configured to be overlapped with the upper bus bar 44.

As a result of the terminal block 39 being electrically connected to the first to fourth conductive paths 27A, 27B, 27C, and 27D, the first conductive path 27A and the third conductive path 27C are electrically connected to each other via the flat plate portion 31A of the first conductive path 27A, the first terminal 41A, the lower bus bar 42, the third terminal 41C, and the flat plate portion 31C of the third conductive path 27C, and the second conductive path 27B and the fourth conductive path 27D are electrically connected to each other via the flat plate portion 31B of the second conductive path 27B, the second terminal 41B, the upper bus bar 44, the fourth terminal 41D, and the flat plate portion 31D of the fourth conductive path 27D. Consequently, the front solar panel 23 and the rear solar panel 24 are connected in parallel.

In the present embodiment, the front solar panel 23 and the rear solar panel 24 connected in parallel and the front electric component 37A and the rear electric component 37B connected in parallel are configured to be electrically connected to each other by the conductive path 11.

Lower Bus Bar 42

Figure 3:
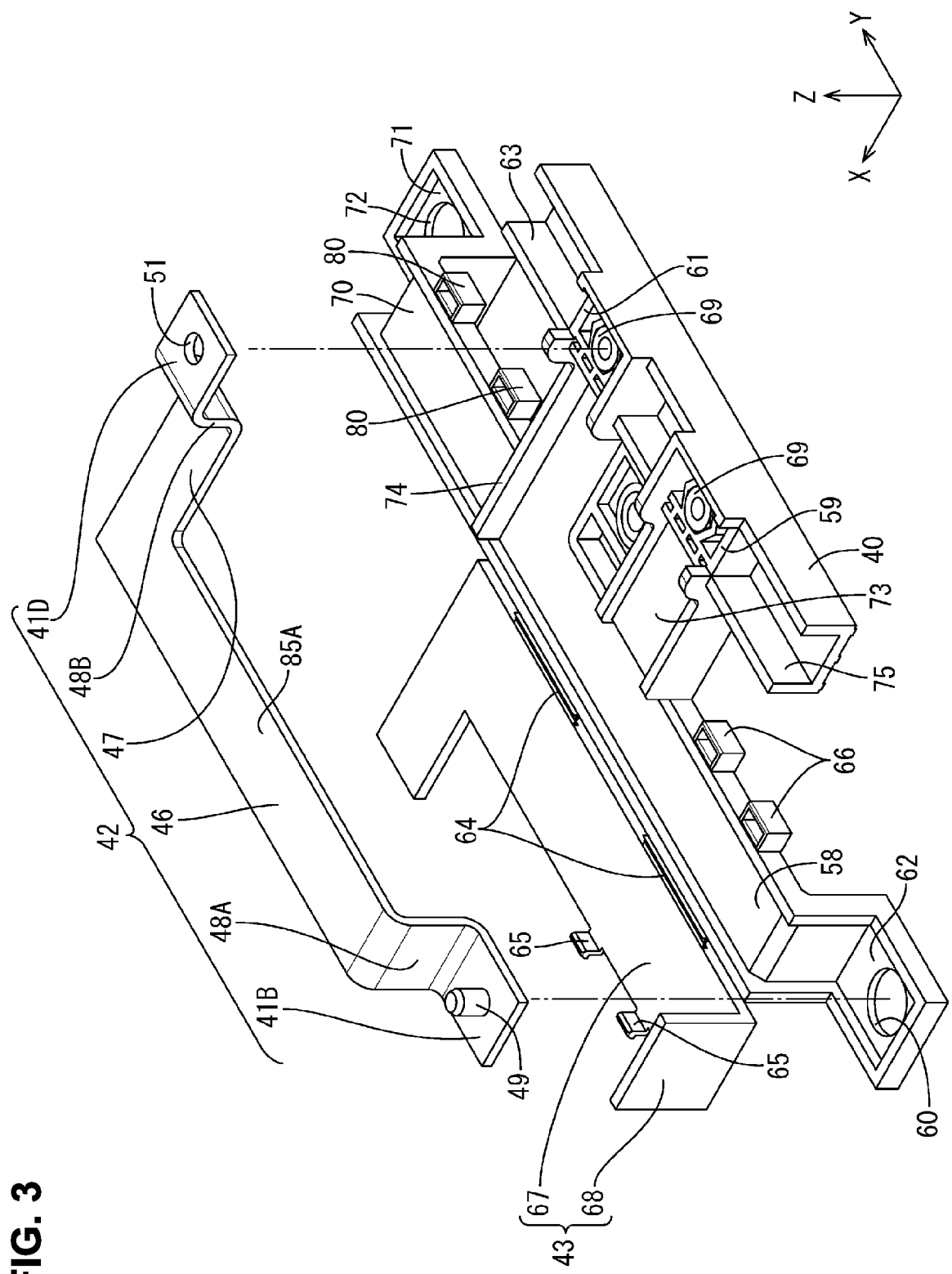
FIG. 3 is an exploded perspective view showing a step of mounting a lower bus bar to a lower cover.

As shown in FIG. 3, the lower bus bar 42 is formed by pressing a metal plate material into a predetermined shape. Any metal such as copper, a copper alloy, aluminum, or an aluminum alloy can be selected as the metal for forming the lower bus bar 42. A plated layer made of any metal such as tin or nickel may be formed on the surface of the lower bus bar 42.

The lower bus bar 42 has a substantially L-shape as viewed from above. The lower bus bar 42 includes a main body portion 46 extending in the front-rear direction, and a bent portion 47 that is bent rightward from a front end portion of the main body portion 46. A downwardly bent stepped portion 48A, and a second terminal 41B that is bent rearward from the stepped portion 48A and is configured to be connected to the flat plate portion 31B of the second conductive path 27B are provided at a rear end portion of the main body portion 46. The second terminal 41B is provided with a stud bolt 49 protruding upward therefrom. As a result of a nut 50 being screwed to the stud bolt 49, and the flat plate portion 31B of the second conductive path 27B being sandwiched between the second terminal 41B and the nut 50, the flat plate portion 31B of the second conductive path 27B and the second terminal 41B are electrically connected to each other.

An upwardly bent stepped portion 48B, and a fourth terminal 41D that is bent rightward from the stepped portion 48B and is configured to be connected to the flat plate portion 31D of the fourth conductive path 27D are provided at a right end portion of the bent portion 47. The fourth terminal 41D is provided with a through hole 51 extending therethrough in the up-down direction.

Upper Bus Bar 44

Figure 5:
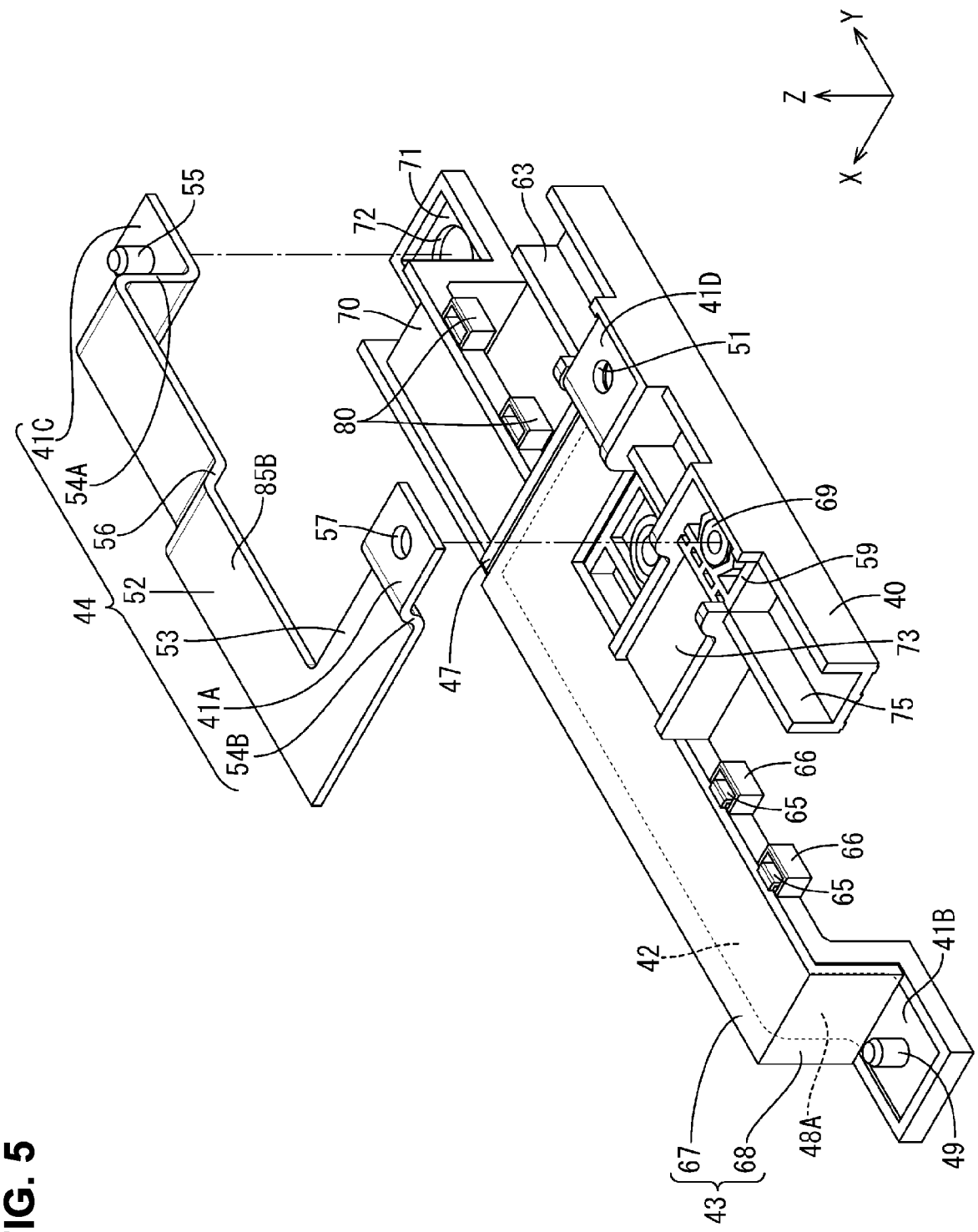
FIG. 5 is an exploded perspective view showing a step of mounting an upper bus bar to the lower cover with a middle cover being closed.

As shown in FIG. 5, the upper bus bar 44 is formed by pressing a metal plate material into a predetermined shape. Any metal such as copper, a copper alloy, aluminum, or an aluminum alloy can be selected as the metal for forming the upper bus bar 44. A plated layer made of any metal such as tin or nickel may be formed on the surface of the upper bus bar 44.

The upper bus bar 44 has a substantially L-shape as viewed from above. The upper bus bar 44 includes a main body portion 52 extending in the front-rear direction, and a bent portion 53 that is bent rightward from a rear end portion of the main body portion 52. A downwardly bent stepped portion 54A, and a third terminal 41C that is bent forward from the stepped portion 54A and is configured to be connected to the flat plate portion 31C of the third conductive path 27C are provided at a front end portion of the main body portion 52. The third terminal 41C is provided with a stud bolt 55 protruding upward therefrom. As a result of a nut 50 being screwed to the stud bolt 55, and the flat plate portion 31C of the third conductive path 27C being sandwiched between the third terminal 41C and the nut 50, the flat plate portion 31 of the third conductive path 27C and the third terminal 41C are electrically connected to each other.

The main body portion 52 includes, in the vicinity of the center thereof in the front-rear direction, an inclined portion 56 standing in the up-down direction and being inclined in the front-rear direction.

An upwardly bent stepped portion 54B, and a first terminal 41A that is bent rightward from the stepped portion 54B and is configured to be connected to the flat plate portion 31A of the first conductive path 27A are provided at a right end portion of the bent portion 53. The first terminal 41A is provided with a through hole 57 extending therethrough in the up-down direction.

Lower Cover 40

As shown in FIG. 3, the lower cover 40 is formed by injection-molding an insulating synthetic resin. The lower cover 40 includes a lower bus bar placement portion 58 on which the lower bus bar 42 is placed. The lower bus bar placement portion 58 has the shape of an upwardly open groove, and also has the same shape as, or a shape slightly larger than, the outer shape of the lower bus bar 42. A second terminal placement portion 62 on which the second terminal 41B is placed is formed at a rear end portion of the lower bus bar placement portion 58 so as to hang downward therefrom.

A head portion (not shown) of the stud bolt 49 provided on the second terminal 41B protrudes downward from a lower surface of the second terminal 41B. A relief hole 60 for avoiding interference with the head portion of the stud bolt 49 is formed in a bottom wall of the second terminal placement portion 62.

A fourth terminal placement portion 61 on which the fourth terminal 41D is placed is provided at a position of the lower bus bar placement portion 58 that corresponds to the fourth terminal 41D of the lower bus bar 42. A nut 69 is embedded in the fourth terminal placement portion 61. The nut 69 is provided at a position corresponding to the through hole 51 provided in the fourth terminal 41D.

A fourth conductive path accommodating portion 63 that is formed in the shape of an upwardly open groove is formed forward of the fourth terminal placement portion 61 so as to extend forward therefrom. The coated wire 28D constituting the fourth conductive path 27D and the terminal fitting 29D are configured to be accommodated inside the fourth conductive path accommodating portion 63.

At a position located leftward of the lower bus bar placement portion 58, the middle cover 43 is formed as a single piece with the lower cover 40 via hinges 64 each having a thin plate shape. The middle cover 43 is made of an insulating synthetic resin, and is formed by the same injection-molding step as that used for the lower cover 40. The hinges 64 are formed so as to be flexibly deformable, and the middle cover 43 is configured to be pivotable about an axis extending in the front-rear direction by the hinges 64 being flexibly deformed. As a result of lock portions 65 formed on an edge of the middle cover 43 that is located opposite to the hinges 64 being elastically locked to lock receiving portions 66 formed on the lower cover 40, the middle cover 43 covers the lower bus bar 42 from above.

The middle cover 43 includes a main body portion 67 that has an L-shape and is configured to cover the lower bus bar 42 from above, and a stepped portion 68 standing from a lower end portion of the main body portion 67. The main body portion 67 has a substantially L-shape as viewed from above. The main body portion 46 and the bent portion 47 of the lower bus bar 42 are configured to be covered from above by the main body portion 67 of the middle cover 43, and the stepped portion 48A on the second terminal 41B side of the lower bus bar 42 is configured to be covered from the rear by the stepped portion 68 of the middle cover 43. In other words, of the lower bus bar 42, the main body portion 46, the bent portion 47, and the stepped portion 48A constitute an overlap portion 85A that is overlapped with the middle cover 43.

As shown in FIG. 5, the upper bus bar 44 is configured to be overlapped with the lower cover 40 and the middle cover 43 in the up-down direction in a state in which the middle cover 43 is closed. A front upper bus bar placement portion 70 with which a front portion of the upper bus bar 44 is overlapped is formed in the shape of an upwardly open groove at a position of the lower cover 40 that is located toward a front end portion thereof in a region exposed from the middle cover 43. A bottom surface of the front upper bus bar placement portion 70 and a bottom surface of the lower bus bar placement portion 58 are set at the same height position in the up-down direction. A partition wall 74 protruding upward and extending in the left-right direction is provided between the front upper bus bar placement portion 70 and the lower bus bar placement portion 58. A third terminal placement portion 71 on which the third terminal 41C is placed is formed at a front end portion of the front upper bus bar placement portion 70 so as to hang downward therefrom.

A portion of the upper bus bar 44 that is overlapped on the middle cover 43 constitutes an overlap portion 85B. Specifically, a region of the main body portion 52 of the upper bus bar 44 that is located rearward of the inclined portion 56 constitutes the overlap portion 85B.

A head portion (not shown) of the stud bolt 55 provided on the third terminal 41C protrudes downward from a lower surface of the third terminal 41C. A relief hole 72 for avoiding interference with the head portion of the stud bolt 55 is formed in a bottom wall of the third terminal placement portion 71.

A rear upper bus bar placement portion 73, on which a rear portion of the upper bus bar 44 is placed, is formed in the shape of an upwardly open groove at a position of the lower cover 40 that is located slightly rearward of the center position thereof in the front-rear direction. An upper surface of the rear upper bus bar placement portion 73 is set at substantially the same height position in the up-down direction as an upper surface of the middle cover 43 in a state in which the lock portions 65 are locked to the lock receiving portions 66.

Figure 6:
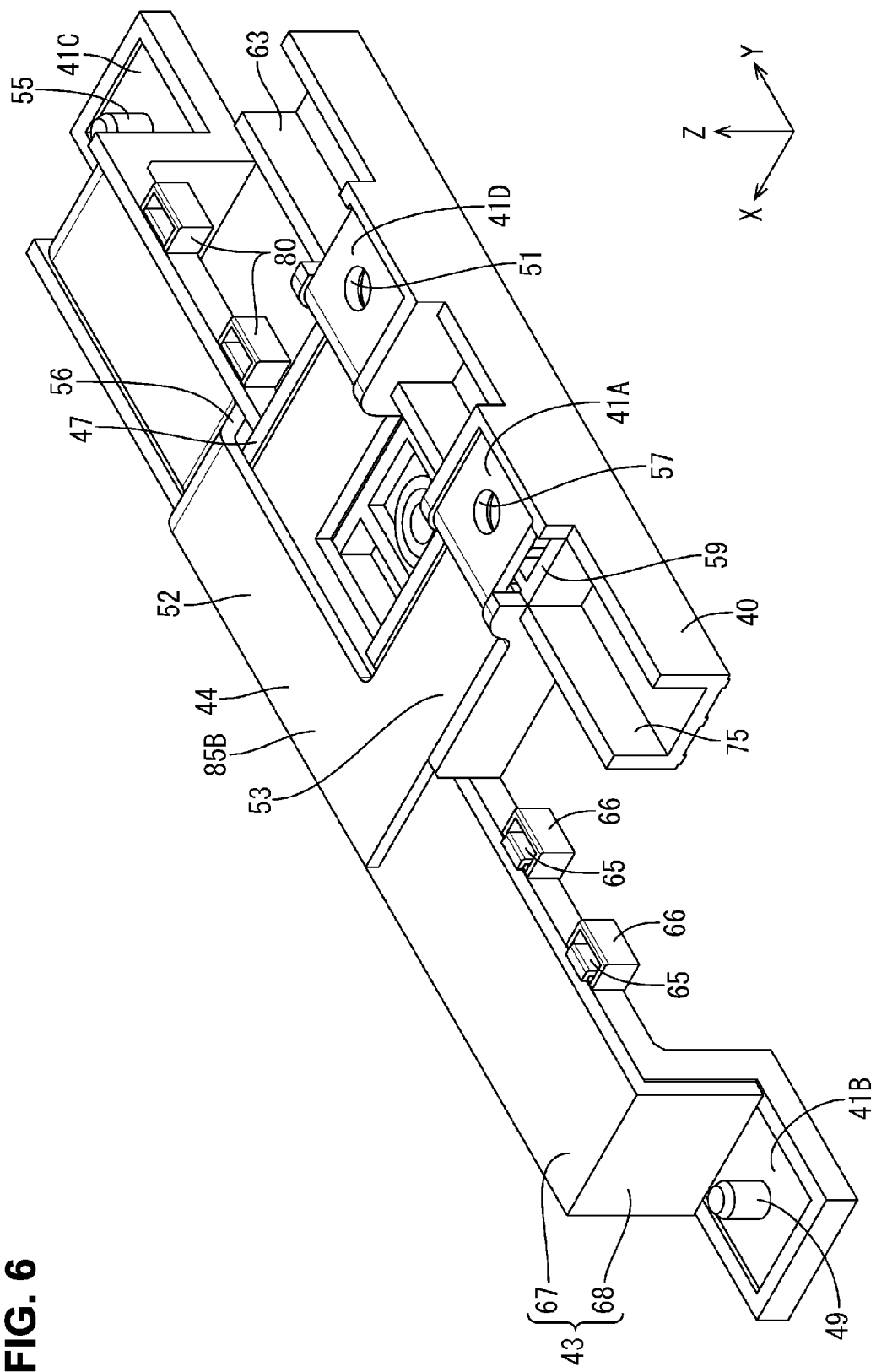
FIG. 6 is a perspective view showing a state in which the upper bus bar has been mounted to the lower cover with the middle cover being closed.

As shown in FIG. 6, the inclined portion 56 of the upper bus bar 44 allows the rear portion of the upper bus bar 44 to ride over the partition wall 74 of the lower bus bar 42 and to be placed on the upper surface of the middle cover 43.

A first terminal placement portion 59 on which the first terminal 41A is placed is provided at a position of the rear upper bus bar placement portion 73 that corresponds to the first terminal 41A of the upper bus bar 44. A nut 69 is embedded in the first terminal placement portion 59. The nut 69 is provided at a position corresponding to the through hole 57 provided in the first terminal 41A.

A first conductive path accommodating portion 75 that is formed in the shape of an upwardly open groove is formed rearward of the first terminal placement portion 59 so as to extend rearward therefrom. The coated wire 28A and the terminal fitting 29A that constitute the first conductive path 27A are configured to be accommodated inside the first conductive path accommodating portion 75.

Figure 7:
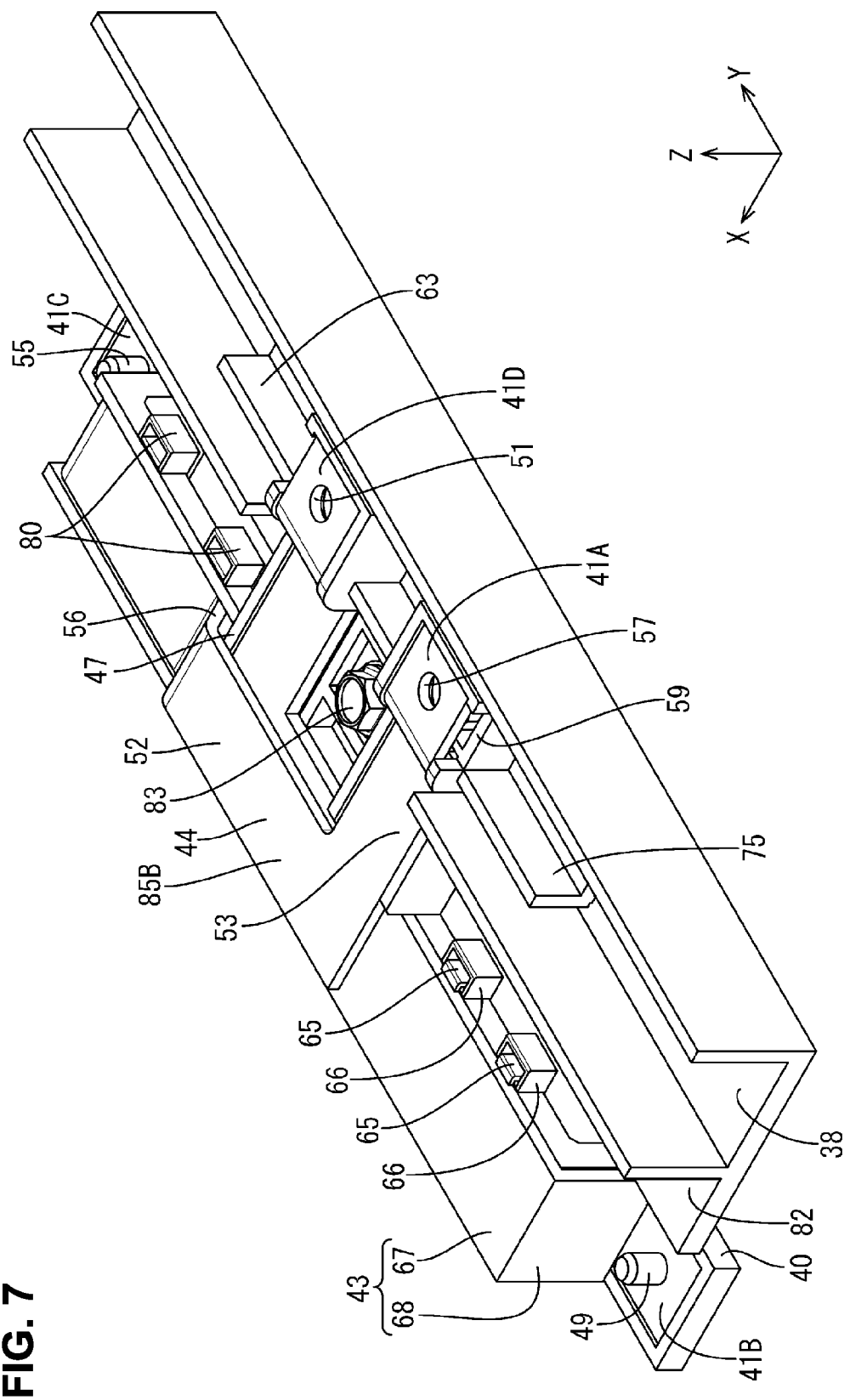
FIG. 7 is a perspective view showing a state in which a structure formed by mounting the lower bus bar and the upper bus bar to the lower cover has been mounted to a routing path.

As shown in FIG. 7, the first conductive path accommodating portion 75 and the fourth conductive path accommodating portion 63 are formed so as to extend coaxially in the front-rear direction, and are configured to be disposed inside the routing path 38.

The lower cover 40 is fixed to the flange 82 using a bolt 83 in a state in which the first conductive path accommodating portion 75 and the fourth conductive path accommodating portion 63 are disposed inside the routing path 38.

The second terminal 41B and the fourth terminal 41D of the lower bus bar 42 are disposed at positions radially spaced apart from the overlap portion 85A that is overlapped with the middle cover 43, and are exposed from the middle cover 43. Also, the first terminal 41A and the third terminal 41C of the upper bus bar 44 are disposed at positions radially spaced apart from the overlap portion 85B that is overlapped with the middle cover 43.

Upper Cover 45

Figure 8:
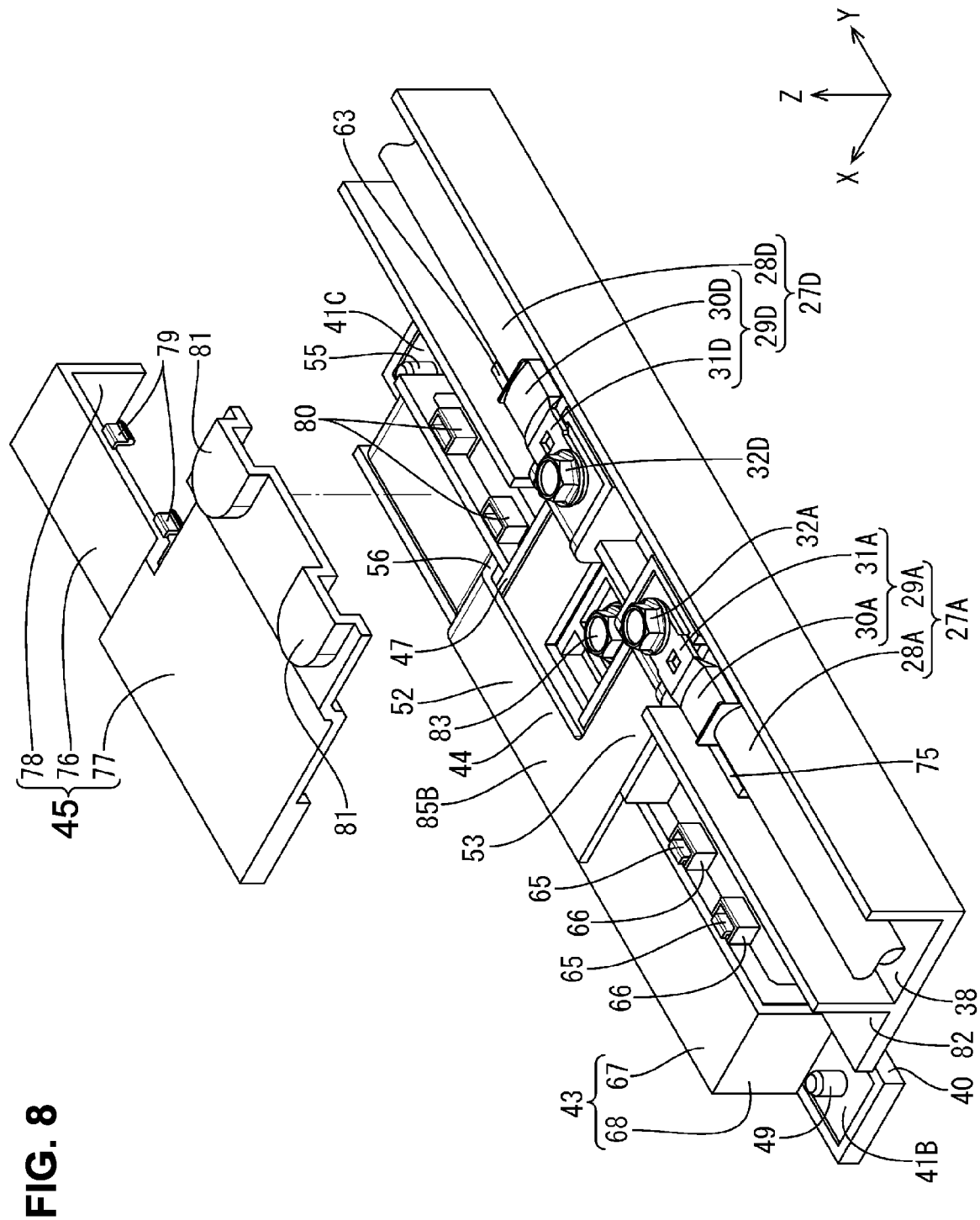
FIG. 8 is an exploded perspective view showing a step of mounting the upper cover to the structure formed by mounting the lower bus bar and the upper bus bar to the lower cover.

As shown in FIG. 8, the upper cover 45 is formed by injection-molding an insulating synthetic resin. The upper cover 45 is configured to be mounted as a single piece to the lower cover 40 while being overlapped on the upper bus bar 44. The upper cover 45 includes a front cover portion 76 that covers a front portion of the upper bus bar 44, and a rear cover portion 77 that covers a rear portion of the upper bus bar 44 and the bent portion 47 of the lower bus bar 42.

A stepped portion 78 extending downward from the front cover portion 76 is provided at a front end portion of the front cover portion 76. The front portion of the upper bus bar 44 is configured to be covered from above by the front cover portion 76, and the stepped portion 54A of the upper bus bar 44 on the third terminal 41C side is configured to be covered from the front by the stepped portion 78 of the front cover portion 76.

Lock portions 79 are formed on the front cover portion 76, and are configured to elastically lock to the lock receiving portions 80 formed on the lower cover 40. Accordingly, the upper cover 45 is configured to be mounted as a single piece to the lower cover 40.

The rear cover portion 77 is formed to be raised one level higher than the front cover portion 76. Accordingly, the inclined portion 56 of the upper bus bar 44 covers the rear portion of the upper bus bar 44 from above so as to conform to the rear portion of the upper bus bar 44 that is formed to be raised one level higher.

The rear cover portion 77 has upwardly bulging bolt relief portions 81 formed at a position thereof corresponding to the first terminal 41A and a position thereof corresponding to the fourth terminal 41D. The bolt relief portions 81 make it possible to avoid interference between the cover portion 77 and the head portions of the bolts 32A and 32D that are fastened to the first terminal 41A and the fourth terminal 41D.

Example of Manufacturing Process

Next, an example of the manufacturing process of the terminal block 39 and the conductive path 11 according to the present embodiment will be described. Note that the manufacturing process of the terminal block 39 and the conductive path 11 is not limited to the following description.

An insulating synthetic resin is injection-molded, thus forming a lower cover 40 integrated as a single component with a middle cover 43, and also forming an upper cover 45.

A metal plate material is pressed, thus forming a lower bus bar 42 and an upper bus bar 44 in predetermined shapes.

Figure 4:
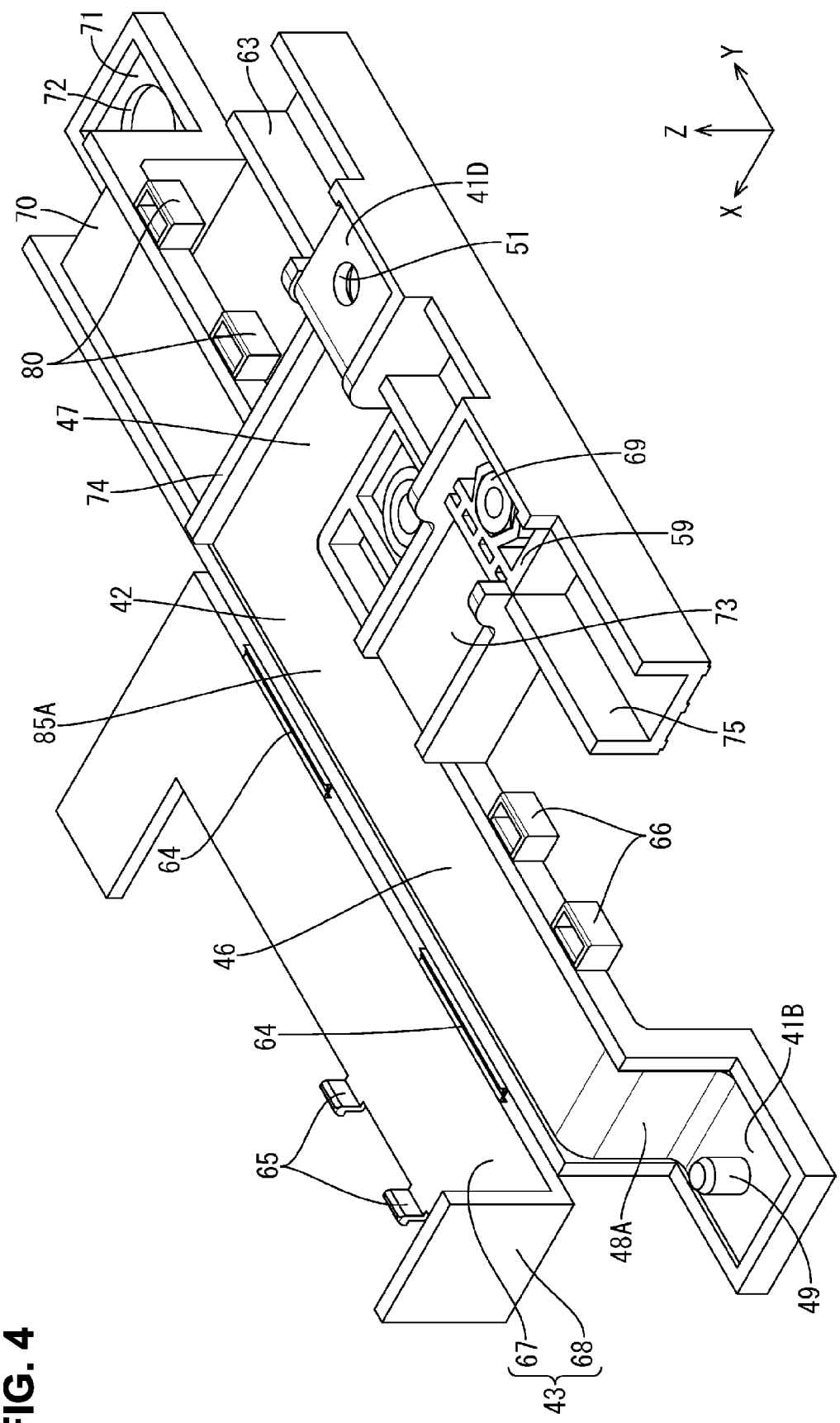
FIG. 4 is a perspective view showing a state in which the lower bus bar has been mounted to the lower cover.

As shown in FIGS. 3 and 4, the lower bus bar 42 is placed on the lower bus bar placement portion 58 of the lower cover 40. Subsequently, as shown in FIG. 5, the middle cover 43 is overlapped above the lower bus bar 42 by flexibly deforming the hinges 64. By elastically locking the lock portions 65 of the middle cover 43 to the lock receiving portions 66 of the lower cover 40, the middle cover 43 is held while covering the lower bus bar 42.

As shown in FIGS. 5 and 6, the upper bus bar 44 is overlapped on the lower cover 40 with the middle cover 43 being closed. Specifically, the upper bus bar 44 is placed on the front upper bus bar placement portion 70 and the rear upper bus bar placement portion 73.

A front solar panel 23 and a rear solar panel 24 are formed by a known method.

A routing path 38 is formed by extrusion-molding aluminum or an aluminum alloy.

A right front pillar 19, a left front pillar 20, a right rear pillar 21, a left rear pillar 22, and a roof frame 13 are formed by a known method.

The front solar panel 23 and the rear solar panel 24 are attached to the roof frame 13. Also, the routing path 38 is attached to a right side member 15.

As shown in FIG. 7, the lower bus bar 42, the lower cover 40 in the state of being attached to the middle cover 43, and the upper bus bar 44 are attached to the routing path 38 using a bolt 83.

A first conductive path 27A, a second conductive path 27B, a third conductive path 27C, a fourth conductive path 27D, a negative electrode branch path 33, and a positive electrode branch path 34 are arranged on the front solar panel 23, the rear solar panel 24, the routing path 38, and the roof frame 13. Also, a positive electrode conductive path 35 and a negative electrode conductive path 36 are arranged on the left front pillar 20, the left side member 16, and the left rear pillar 22.

As shown in FIG. 8, the lower cover 40, the lower bus bar 42 in a state of being attached to the middle cover 43, and the upper bus bar 44 are connected to the first conductive path 27A and the fourth conductive path 27D.

Figure 9:
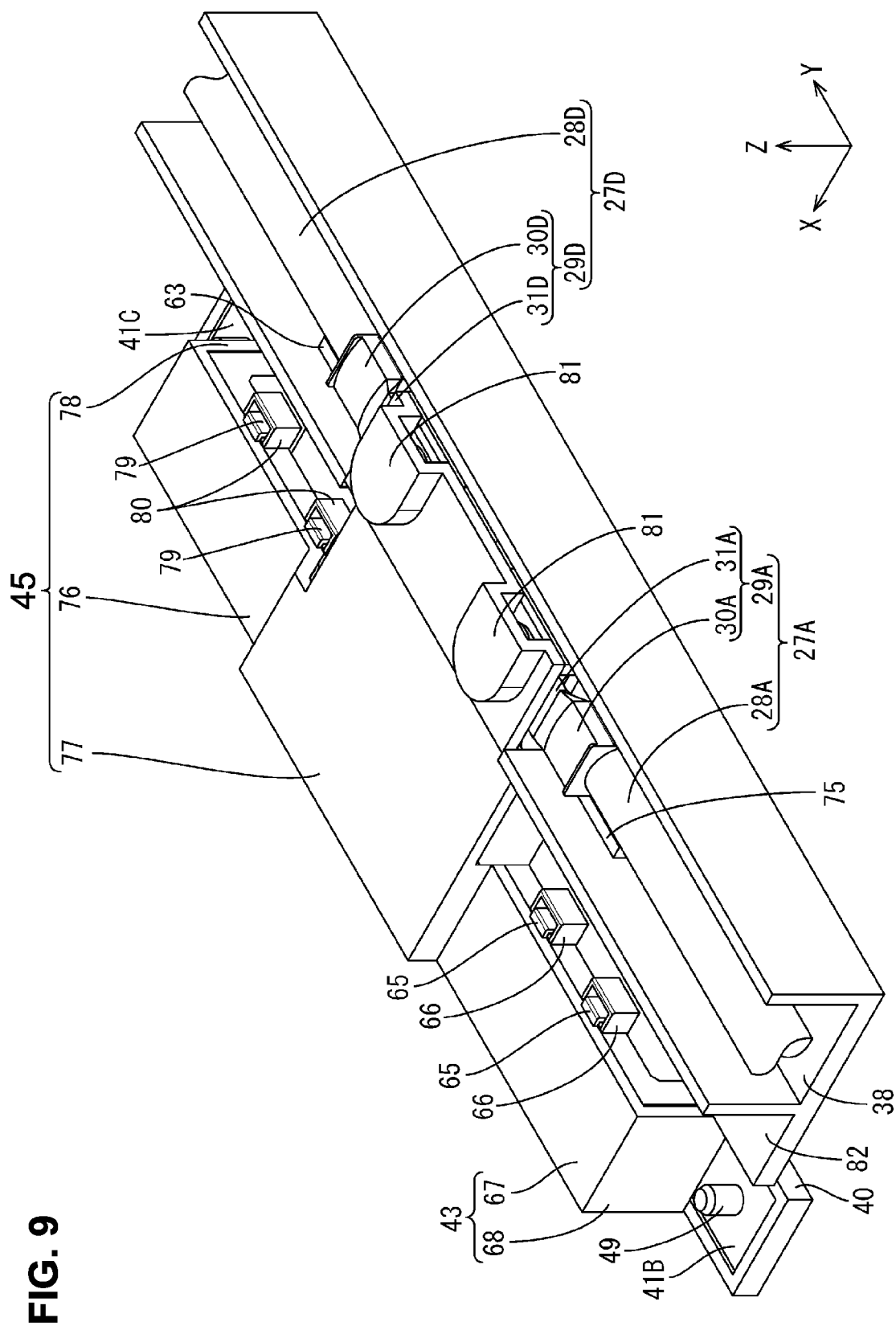
FIG. 9 is a perspective view showing a state in which the upper cover has been mounted to the structure formed by mounting the lower bus bar and the upper bus bar to the lower cover.

Subsequently, as shown in FIGS. 8 and 9, the upper cover 45 is mounted from above to the lower bus bar 42, and the lower cover 40 on which the upper bus bar 44 is disposed. By elastically locking the lock portions 79 of the upper cover 45 to the lock receiving portions 80 of the lower cover 40, the upper cover 45 is mounted as a single piece to the lower cover 40. Thus, the terminal block 39 is completed. Furthermore, the flat plate portion 31B of the second conductive path 27B is connected to the second terminal 41B, and the flat plate portion 31C of the third conductive path 27C is connected to the third terminal 41C. Thus, the terminal block 39 and the conductive path 11 are completed.

Operations and Effects of the Embodiment

Next, operations and effects of the present embodiment will be described. The present embodiment is a terminal block 39 including a lower bus bar 42 and an upper bus bar 44 that include overlap portions 85A, 85B and that overlap each other at the overlap portions 85A, 85B, and an insulating middle cover 43 disposed between the overlap portion 85A of the lower bus bar 42 and the overlap portion 85B of the upper bus bar 44, wherein the lower bus bar 42 and the upper bus bar 44 are provided with their respective ones of terminals 41A, 41B, 41C, 41D exposed from the middle cover 43, at positions different from the overlap portions 85A, 85B, and the terminals 41A, 41B, 41C, 41D are disposed at positions radially spaced apart from the overlap portions 85A, 85B.

According to the above-described configuration, the lower bus bar 42 and the upper bus bar 44 are insulated by the middle cover 43, and it is thus possible to reduce the routing space as compared with a case where a plurality of conductive paths on which one bus bar is disposed in one cover are used.

According to the present embodiment, the insulating lower cover 40 is mounted below the lower bus bar 42, which is located at the lowermost portion in the up-down direction. Also, the insulating upper cover 45 is mounted above the upper bus bar 44, which is located at the uppermost portion in the up-down direction.

According to the above-described configuration, the lower bus bar 42 is insulated by the lower cover 40, and the upper bus bar 44 is insulated by the upper cover 45. Accordingly, it is possible to suppress the occurrence of a short circuit caused by a foreign object coming into contact with the lower bus bar 42 and the upper bus bar 44.

According to the present embodiment, the middle cover 43 is formed as a single piece with the lower cover 40 via the hinges 64 having flexibility.

According to the above-described configuration, the middle cover 43 and the lower cover 40 can be formed as a single piece, and it is thus possible to reduce the number of components. In addition, the middle cover 43 can be overlapped with the lower bus bar 42 by a simple operation of flexibly deforming the hinges 64, and it is thus possible to increase the efficiency of the manufacturing operation of the terminal block 39.

A conductive path 11 according to the present embodiment includes a terminal block 39, a first conductive path 27A, and a fourth conductive path 27D that are disposed on a routing path 38, and a second conductive path 27B and a third conductive path 27C that are disposed at locations different from the routing path 38, wherein the first conductive path 27A and the third conductive path 27C are electrically connected to each other via the terminal block 39, and the second conductive path 27B and the fourth conductive path 27D are electrically connected to each other via the terminal block 39.

According to the above-described configuration, the routing path 38 can be shared by the first conductive path 27A and the fourth conductive path 27D, and it is thus possible to increase the routing space efficiency of the conductive path 11 as compared with a case where the first conductive path 27A and the fourth conductive path 27D are disposed on routing paths that are different from each other.

Embodiment 2

Next, Embodiment 2 of the technique disclosed in the present specification will be described with reference to FIGS. 11 to 22.

Figure 11:
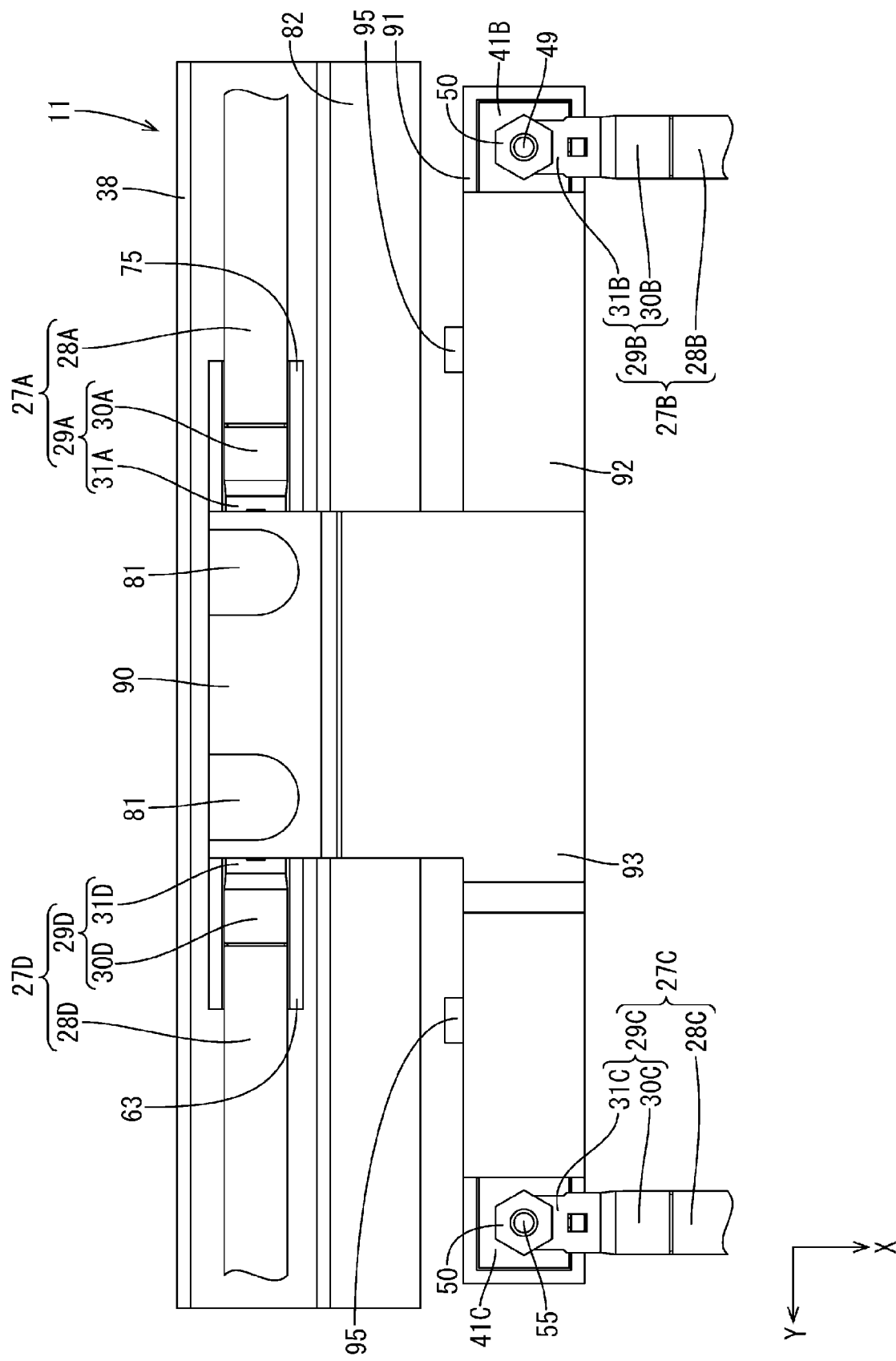
FIG. 11 is a partially enlarged plan view showing a conductive path and a terminal block according to Embodiment 2.
Figure 12:
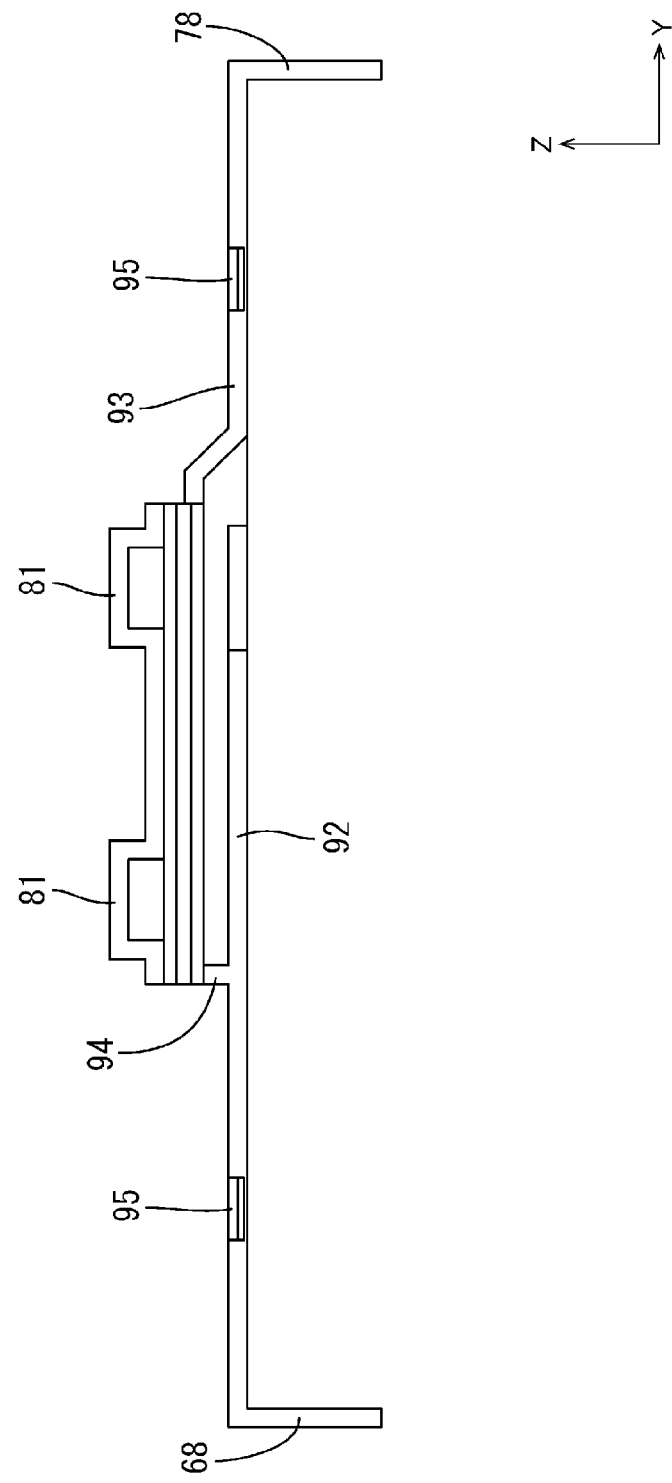
FIG. 12 is a front view showing an upper cover that is formed as a single piece with a middle cover.
Figure 13:
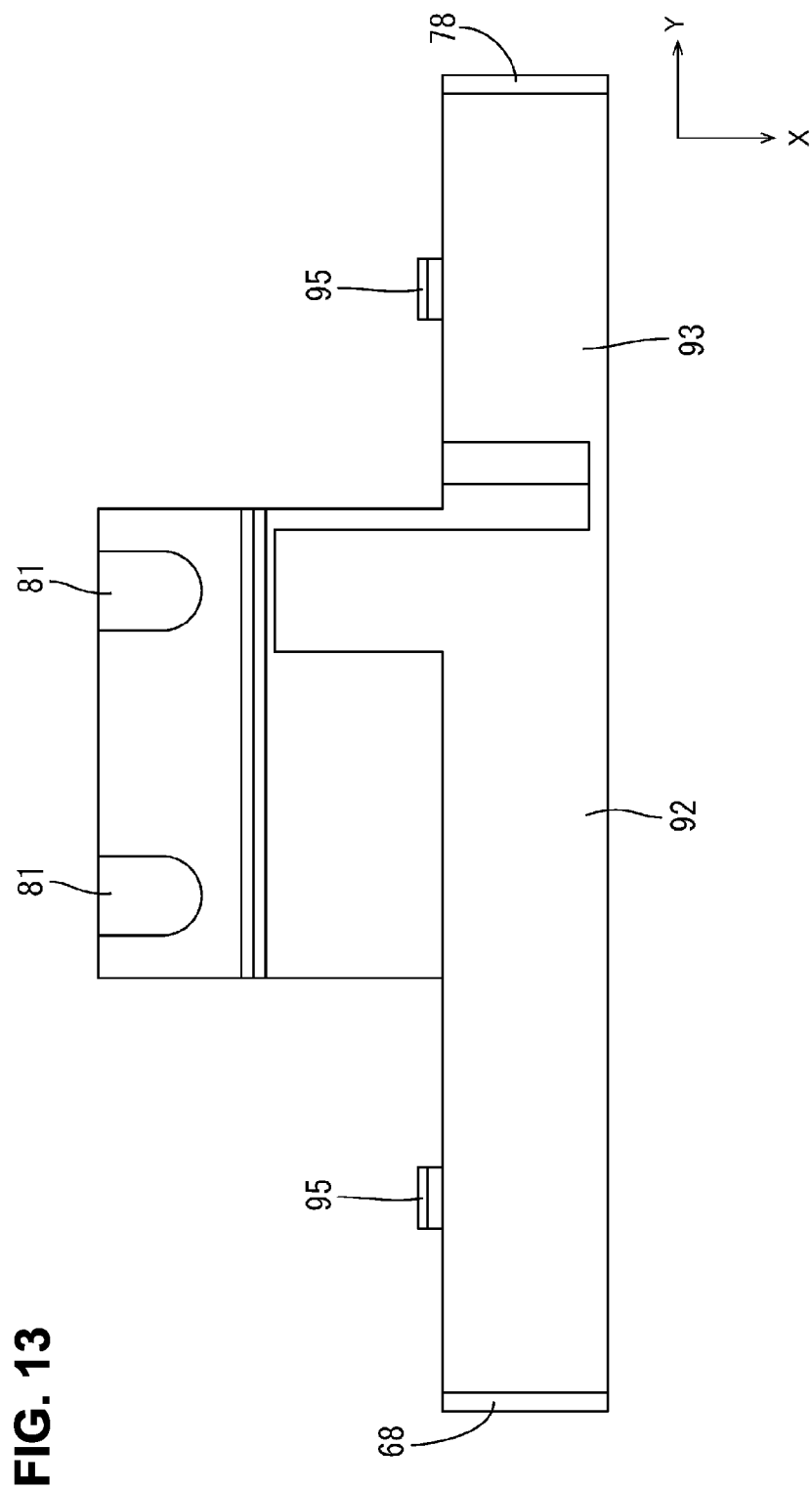
FIG. 13 is a bottom view showing the upper cover that is formed as a single piece with the middle cover.
Figure 15:
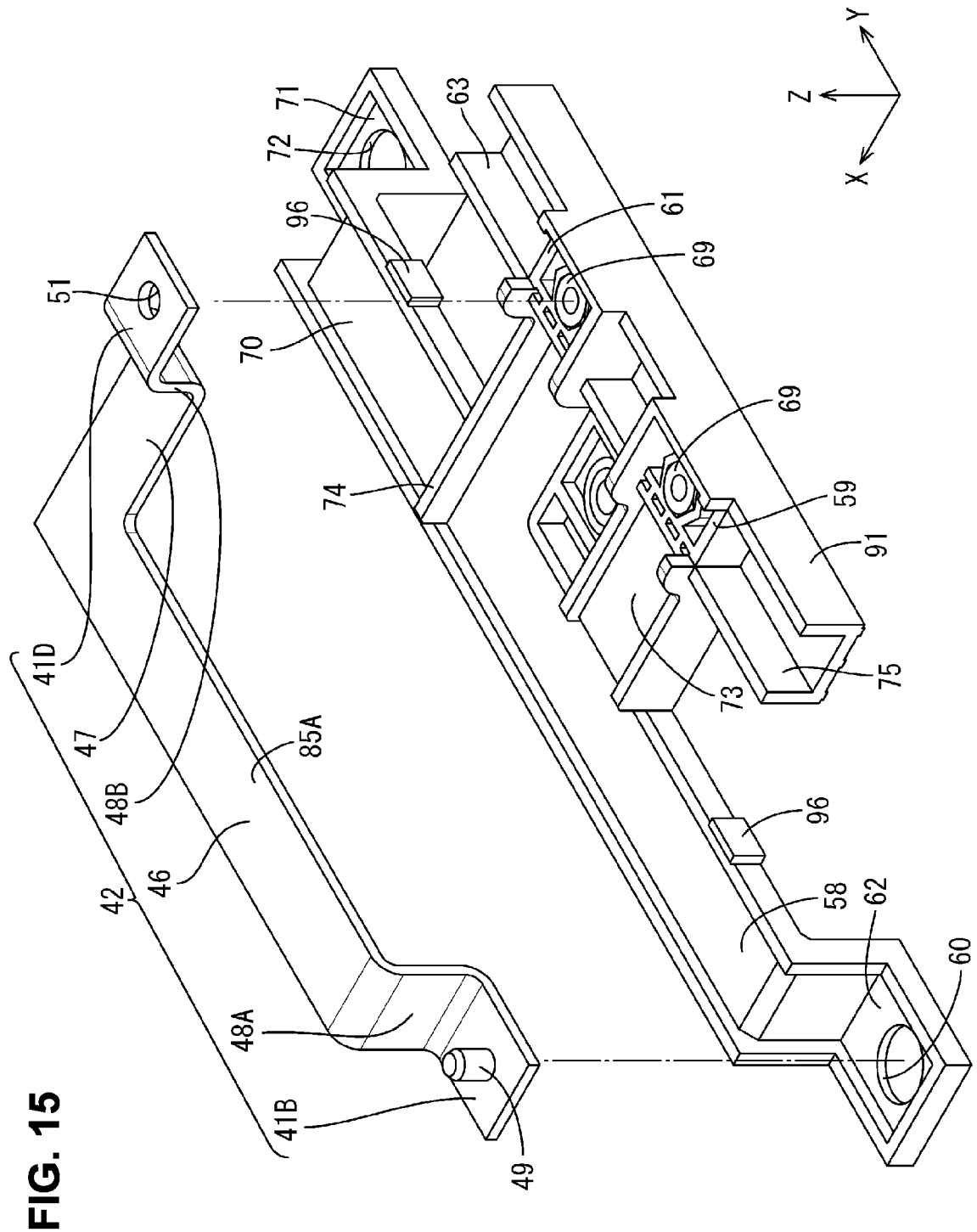
FIG. 15 is an exploded perspective view showing a step of mounting a lower bus bar to a lower cover.

As shown in FIG. 11, a terminal block 90 according to the present embodiment includes a lower cover 91, and an upper cover 93 that is formed as a single piece with a middle cover 92. As shown in FIG. 15, the lower cover 91 according to the present embodiment is different from the lower cover 40 according to Embodiment 1 in that the hinges 64, and the middle cover 43 that is formed as a single piece with the hinges 64 are not provided.

As shown in FIGS. 11 to 14, the middle cover 92 according to the present embodiment is formed as a component separate from the lower cover 40. An upwardly extending coupling portion 94 is formed as a single piece with a left edge of the middle cover 92. The upper cover 93 is formed as a single piece with an upper end portion of the coupling portion 94. The coupling portion 94 has a plate shape extending in the up-down direction and also extending in the front-rear direction.

The rest of the configuration is substantially the same as that of Embodiment 1, and therefore the same members are denoted by the same reference numerals, and redundant descriptions thereof have been omitted.

Manufacturing Process

Next, an example of the manufacturing process of a terminal block 39 according to the present embodiment will be described. Note that the manufacturing process of the terminal block 39 is not limited to the following description. Additionally, the descriptions of steps that are the same as those of the manufacturing process according to Embodiment 1 have been omitted.

An insulating synthetic resin is injection-molded, thus forming a lower cover 91, and also forming an upper cover 93 integrated as a single component with a middle cover 92.

Figure 16:
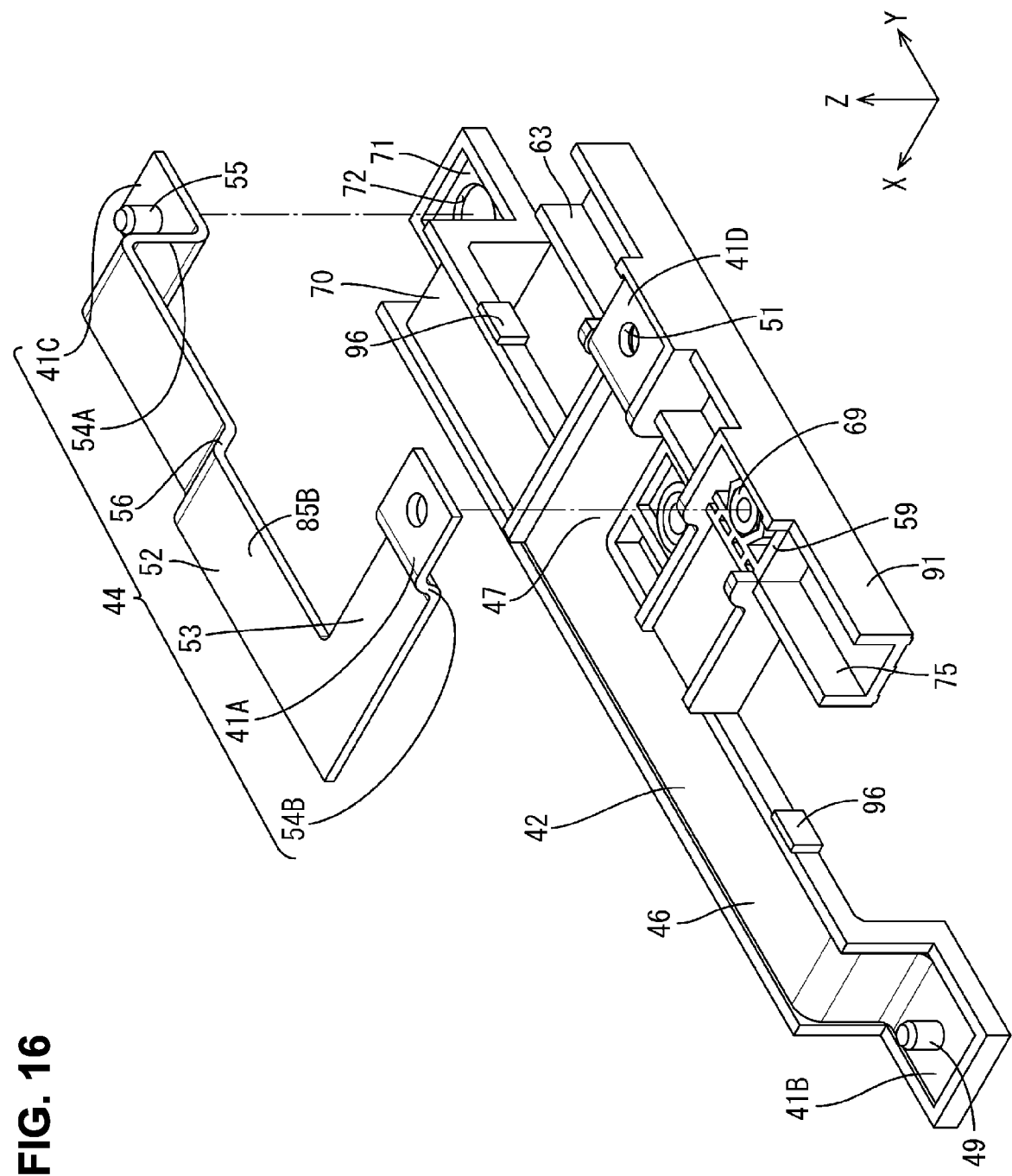
FIG. 16 is an exploded perspective view showing a step of mounting an upper bus bar to the lower cover.
Figure 17:
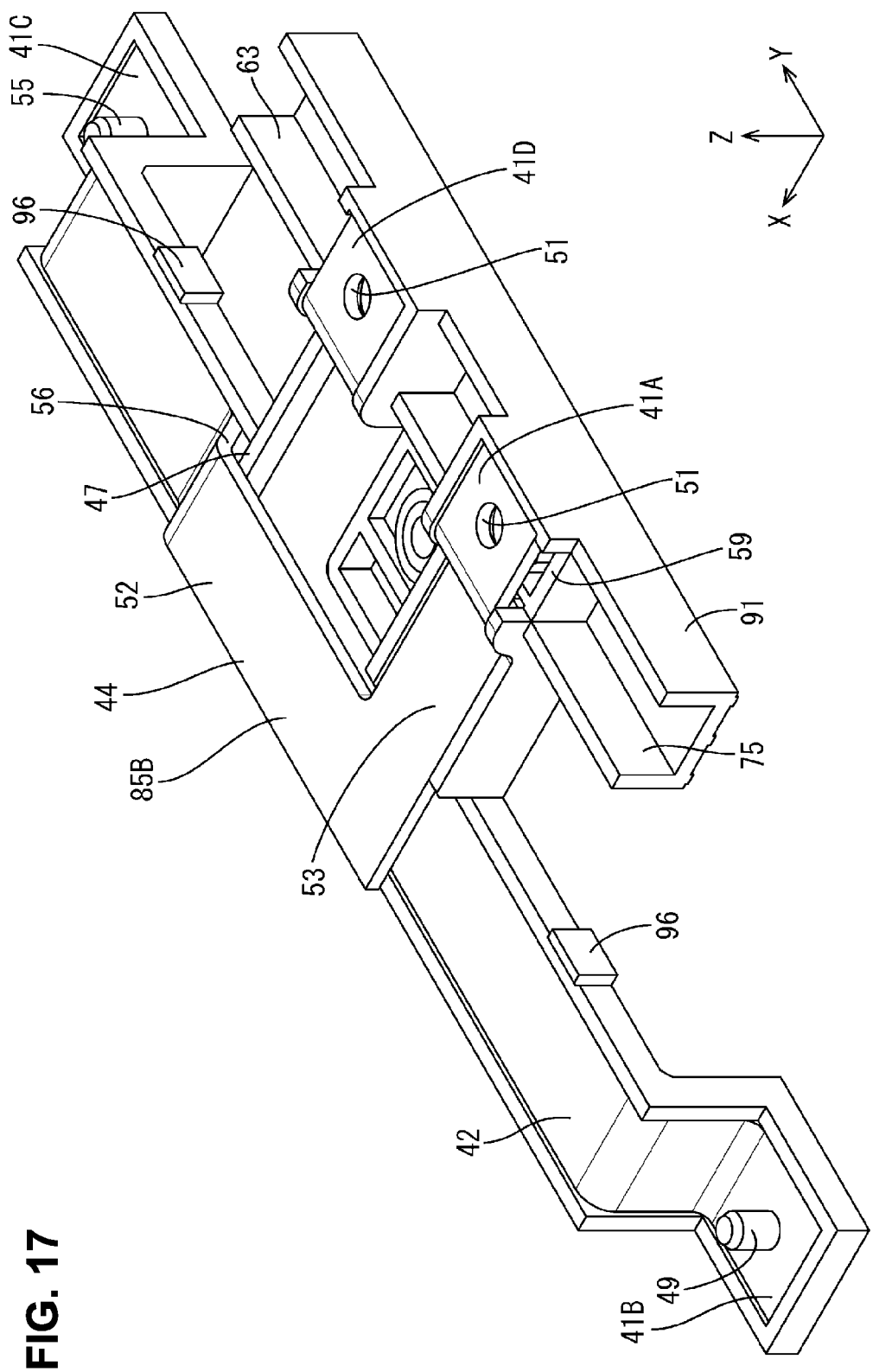
FIG. 17 is a perspective view showing a state in which the upper bus bar has been mounted to the lower cover.
Figure 18:
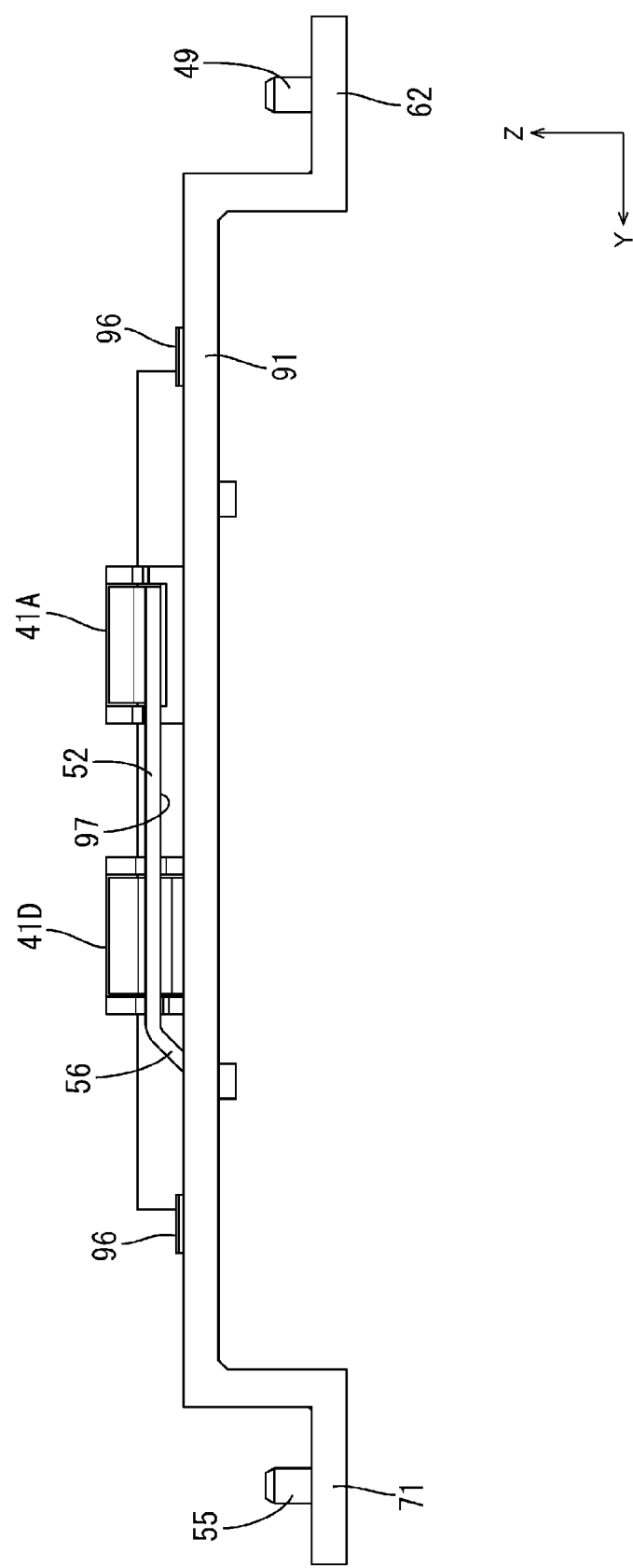
FIG. 18 is a rear view showing a state in which the upper bus bar has been mounted to the lower cover.

As shown in FIGS. 15 and 16, a lower bus bar 42 is placed on the lower bus bar placement portion 58 of the lower cover 91. Subsequently, as shown in FIGS. 16 and 17, an upper bus bar 44 is overlapped above the lower bus bar 42. Specifically, the upper bus bar 44 is placed on the front upper bus bar placement portion 70 and the rear upper bus bar placement portion 73 of the lower cover 91. As shown in FIG. 18, in this state, a gap 97 is formed between the lower bus bar 42 and the upper bus bar 44. The thickness dimension of the middle cover 92 in the up-down direction is set to be the same as, or smaller than the space of the gap 97 in the up-down direction.

Figure 19:
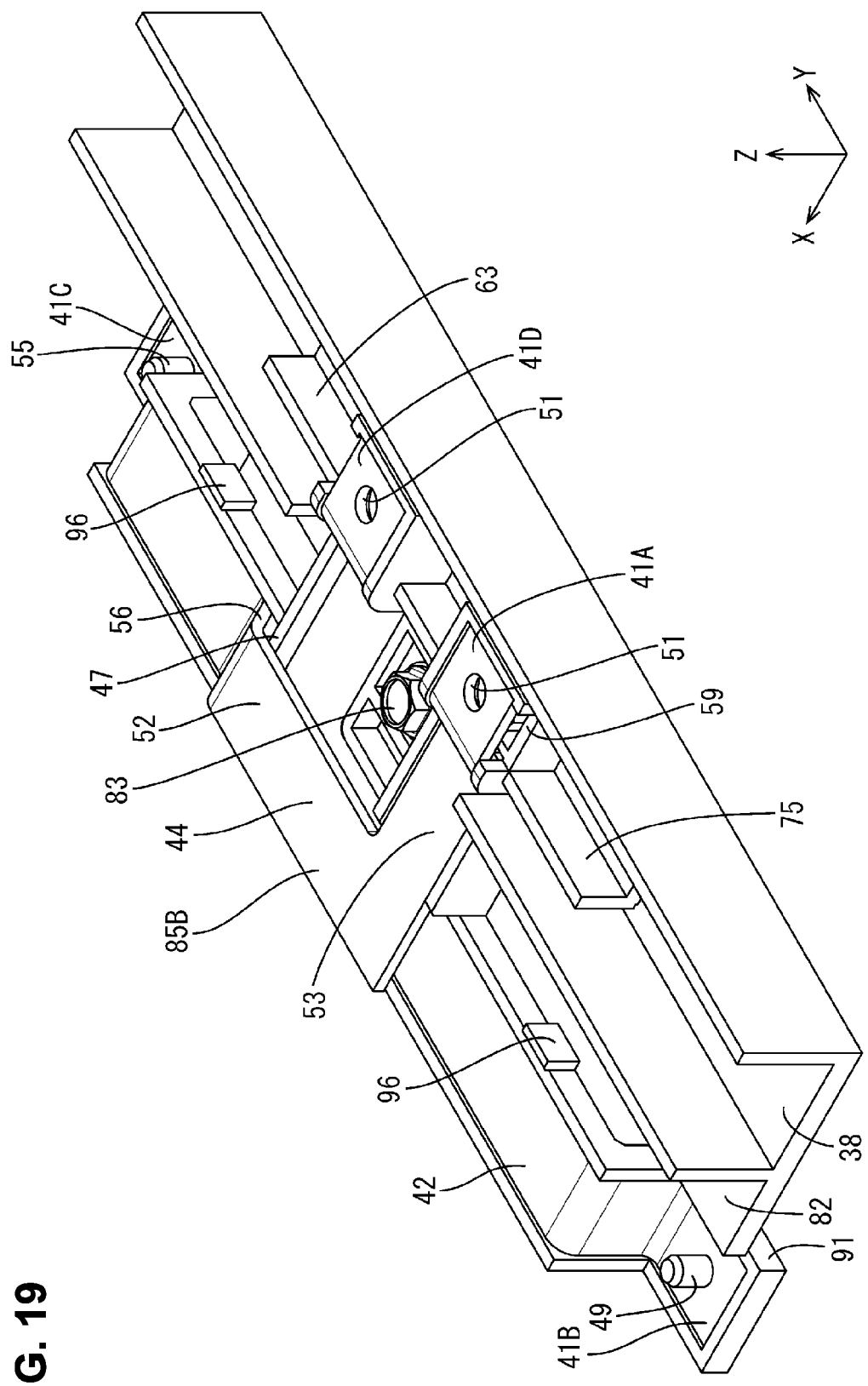
FIG. 19 is a perspective view showing a state in which a structure formed by mounting the lower bus bar and the upper bus bar to the lower cover has been mounted to a routing path.

As shown in FIG. 19, the lower bus bar 42 in the state of being attached to the lower cover 91, and the upper bus bar 44 are attached to a routing path 38 using a bolt 83. Subsequently, as shown in FIG. 20, the lower bus bar 42 in the state of being attached to the lower cover 91, and the upper bus bar 44 are connected to a first conductive path 27A and a fourth conductive path 27D.

Figure 20:
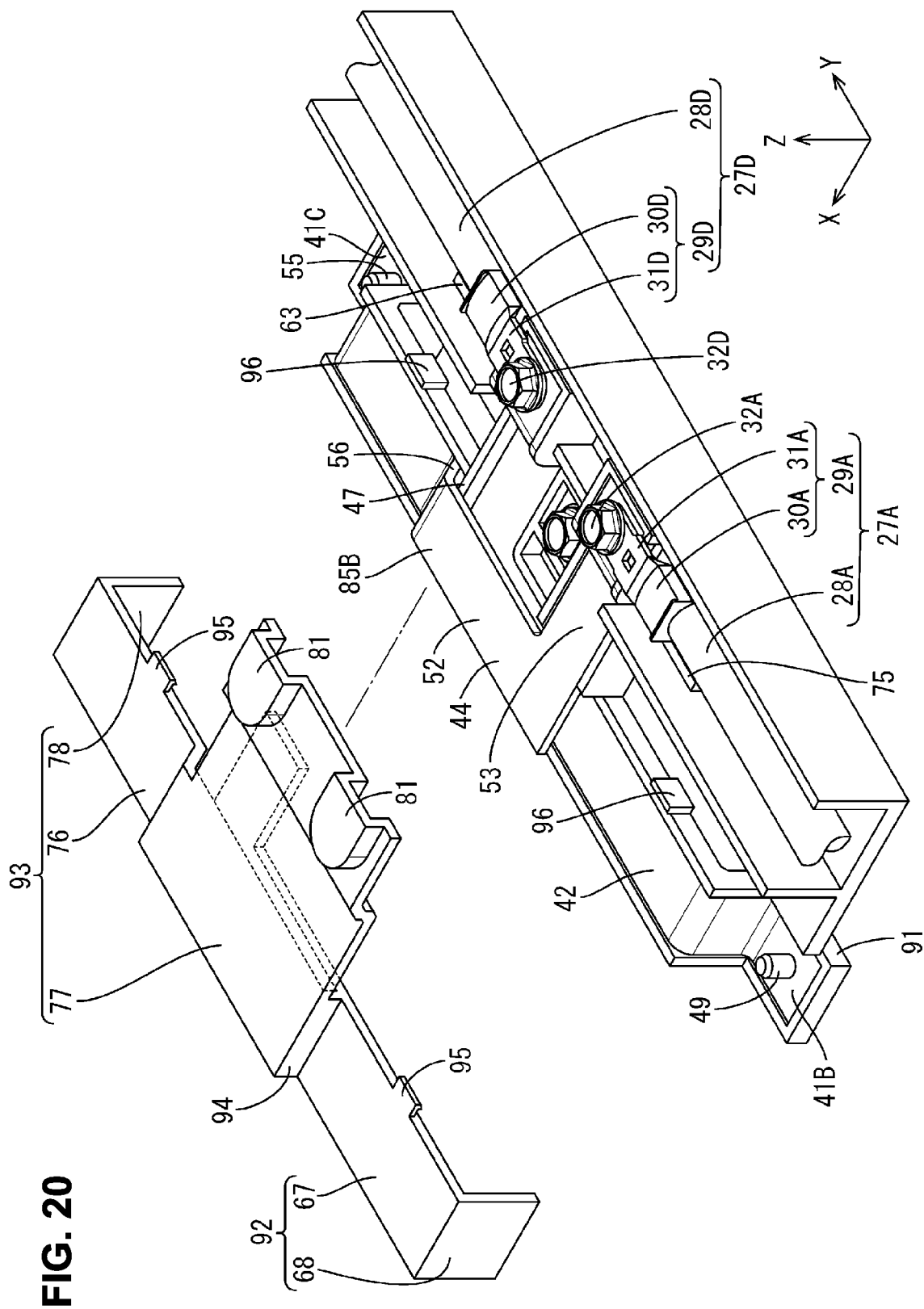
FIG. 20 is an exploded perspective view showing a step of mounting the upper cover to the structure formed by mounting the lower bus bar and the upper bus bar to the lower cover.
Figure 21:
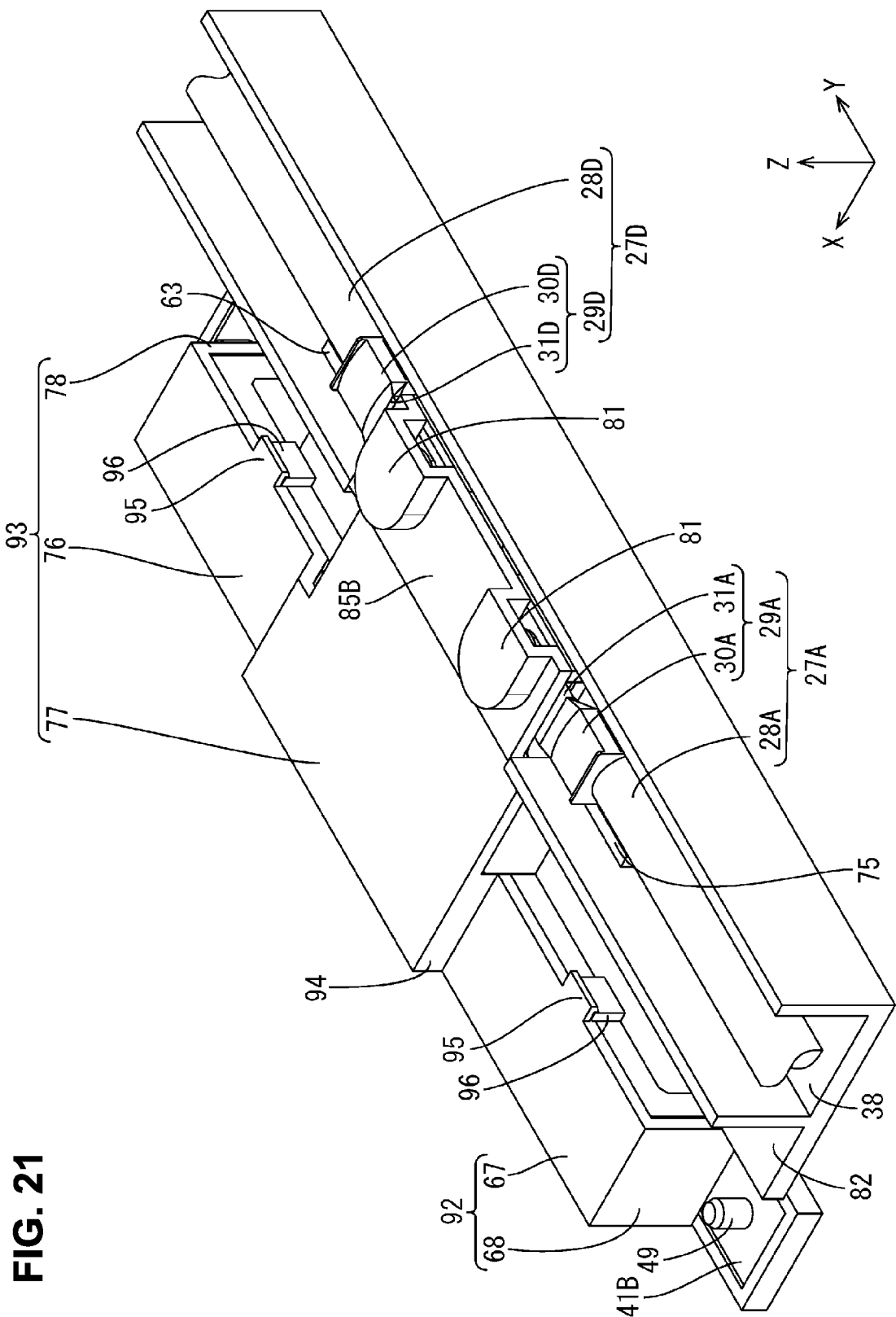
FIG. 21 is a perspective view showing a state in which the upper cover has been mounted to the structure formed by mounting the lower bus bar and the upper bus bar to the lower cover.
Figure 22:
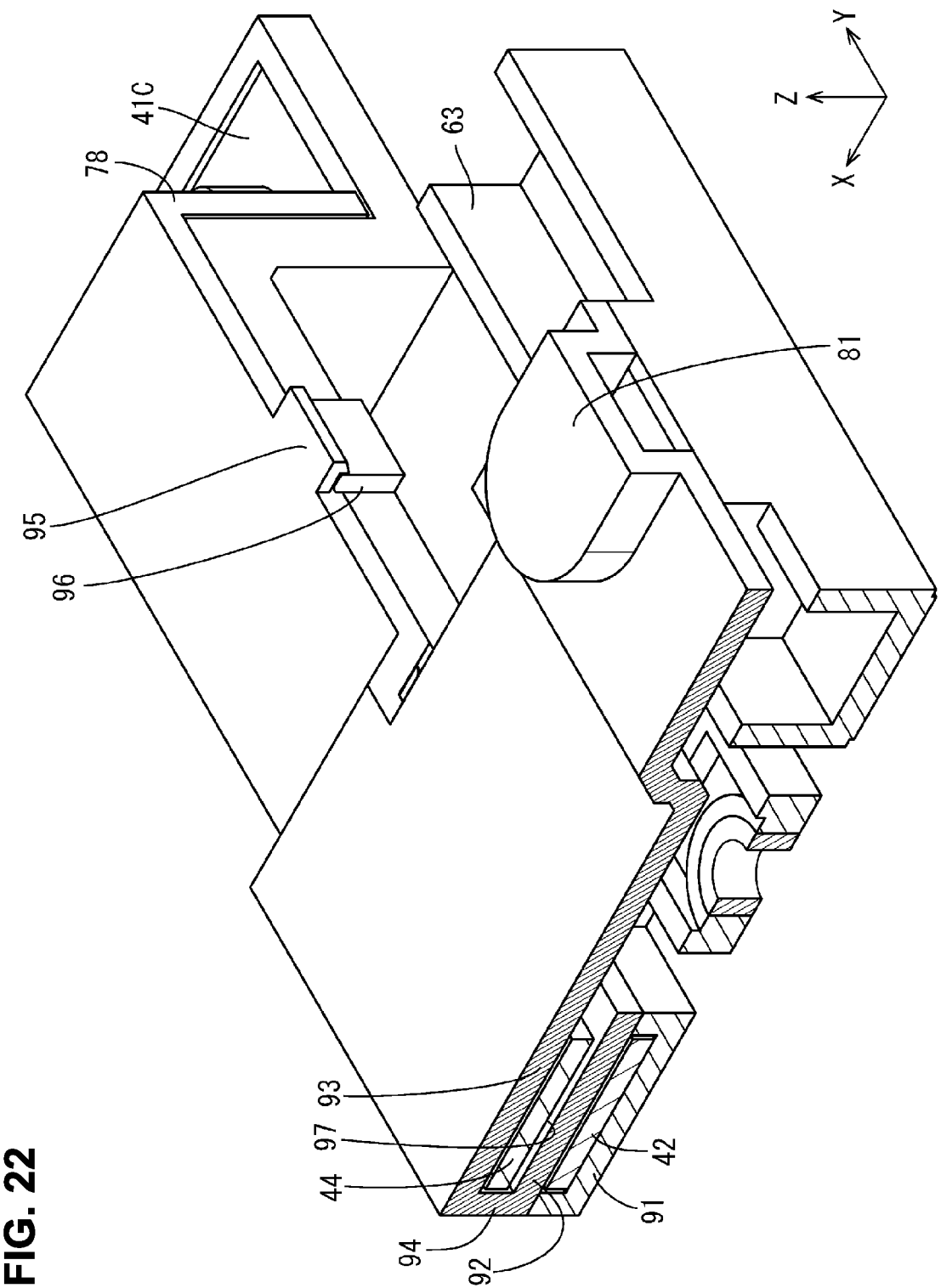
FIG. 22 is a partially enlarged cross-sectional view showing a state in which the lower bus bar and the upper bus bar are insulated by the middle cover.

Subsequently, as shown in FIGS. 20 and 21, the upper cover 93 with which the middle cover 92 is formed as a single piece is mounted from the left side to the lower cover 91 on which the lower bus bar 42 and the upper bus bar 44 are disposed. By elastically locking the lock portions 95 of the middle cover 92 to the lock receiving portions 96 of the lower cover 91, the middle cover 92 is mounted as a single piece to the lower cover 91. As shown in FIG. 22, the middle cover 92 is inserted into the gap 97 formed between the lower bus bar 42 and the upper bus bar 44, and thus the lower bus bar 42 and the upper bus bar 44 are insulated by the middle cover 92.

By elastically locking the lock portions 95 of the upper cover 93 to the lock receiving portions 96 of the lower cover 91, the upper cover 93 is mounted as a single piece to the lower cover 91. Thus, the terminal block 90 is completed.

Next, operations and effects of the present embodiment will be described. According to the present embodiment, the middle cover 92 is coupled to the upper cover 93 by the coupling portion 94 extending along the up-down direction.

According to the above-described configuration, the middle cover 92 and the upper cover 93 can be formed as a single piece, and it is thus possible to reduce the number of components.

In addition, it is possible to electrically insulate the lower bus bar 42 and the upper bus bar 44 by a simple method in which the middle cover 92 is inserted from the left side into the gap 97 between the lower bus bar 42 and the upper bus bar 44.

Other Embodiments

The technique disclosed in the present specification is not limited to the embodiments described and illustrated above. For example, the following embodiments also fall within the technical scope of the technique disclosed in the present specification.

(1) The present embodiment adopts a configuration in which the terminal block includes two bus bars; however, the disclosed technique is not limited thereto, and it is also possible to adopt a configuration in which the terminal block includes three or more bus bars.

(2) The present embodiment adopts a configuration in which two terminals are provided at opposite ends of one bus bar; however, the disclosed technique is not limited thereto, and it is also possible to adopt a configuration in which, in addition to opposite ends of one bus bar, a terminal is provided at an end of a branch portion branched from the bus bar. In other words, it is also possible to adopt a configuration in which one bus bar includes three or more terminals.

(3) The lower cover, the middle cover, and the upper cover may be formed as a single piece by forming the lower bus bar 42 and the upper bus bar 44 by insert-molding an insulating synthetic resin.

(4) The lower cover, the middle cover, and the upper cover may be members that are separate from one another.

(5) The middle cover and the upper cover may be formed as a single piece by a hinge. It is also possible to adopt a configuration in which a lower cover and a middle cover are formed as a single piece by a hinge, and also the middle cover and an upper cover are formed as a single piece by a hinge.

(6) It is also possible to adopt a configuration in which the lower cover and the middle cover are coupled by a coupling portion. It is also possible to adopt a configuration in which the lower cover, the middle cover, and the upper cover are coupled as a single piece by the coupling portion 94 extending in the up-down direction.

(7) It is also possible to adopt a configuration in which the first conductive path 27A and the fourth conductive path 27D are disposed on separate routing paths 38.

(8) It is also possible to adopt a configuration in which the first terminal 41A, the second terminal 41B, the third terminal 41C, and the fourth terminal 41D are disposed at the same height position in the up-down direction.

(9) It is also possible to adopt a configuration in which the terminal block is disposed inside an electricity storage pack in which a plurality of electricity storage elements are accommodated inside a case, and the terminal block can be disposed at any position of the vehicle 10. Accordingly, the terminal block can electrically connect the plurality of electricity storage elements.

(10) In the case where the second conductive path 27B and the fourth conductive path 27D are omitted, the lower bus bar 42 and the middle cover 43 may be omitted. Similarly, in the case where the first conductive path 27A and the third conductive path 27C are omitted, the upper bus bar 44 and the middle cover 43 may be omitted.

(11) A first end portion, a second end portion, a third end portion, and a fourth end portion are constituted by the flat plate portions 31A, 31B, 31C, and 31D of the terminal fittings 29A, 29B, 29C, and 29D; however, the disclosed technique is not limited thereto, and they may be ends of the wires that form the first to fourth conductive paths 27A, 27B, 27C, and 27D. In the case where the first to fourth conductive paths 27A, 27B, 27C, and 27D are formed by bus bars, they may be ends of the bus bars.

LIST OF REFERENCE NUMERALS

11 Conductive path
27A First conductive path (example of routing conductive path)
27B Second conductive path (example of lead-out conductive path)
27C Third conductive path (example of lead-out conductive path)
27D Fourth conductive path (example of routing conductive path)
38 Routing path
39, 90 Terminal block
40, 91 Lower cover (example of outer cover)
41A First terminal (example of terminal)
41B Second terminal (example of terminal)
41C Third terminal (example of terminal)
41D Fourth terminal (example of terminal)
42 Lower bus bar (example of bus bar)
43, 92 Middle cover
44 Upper bus bar (example of bus bar)
45, 93 Upper cover (example of outer cover)
64 Hinge
85A, 85B Overlap portion
94 Coupling portion

The invention claimed is:

1. A terminal block comprising;
a plurality of bus bars that include overlap portions and that overlap each other at the overlap portions, the plurality of bus bars including a lower bus bar and an upper bus bar adjacent to each other in an overlapping direction in which the overlap portions are overlapped, the lower bus bar including a flat portion that includes an overlap portion and a non-overlap portion, wherein the overlap portion of the lower bus bar overlaps an overlap portion of the upper bus bar, and the non-overlap portion does not overlap the upper bus bar; and
an insulating middle cover disposed between the lower and upper bus bars, such that the insulating middle cover covers both the overlap portion and the non-overlap portion of the flat portion of the lower bus bar,
wherein each of the plurality of bus bars is provided with a plurality of terminals exposed from the middle cover, at positions different from the overlap portions, and
the plurality of terminals are disposed at positions radially spaced apart from the overlap portions.

2. The terminal block according to claim 1,
wherein an insulating outer cover is mounted to an outermost bus bar of the plurality of bus bars, such that the outermost bus bar contacts the insulating outer cover, the outermost bus bar being located outermost in the overlapping direction.

3. The terminal block according to claim 2,
wherein the middle cover is formed as a single piece with at least one side of the outer cover via a hinge having flexibility.

4. The terminal block according to claim 2,
wherein the middle cover is coupled to at least one side of the outer cover by a coupling portion.

5. A conductive path comprising:
the terminal block according to claim 1;
a plurality of routing conductive paths disposed on one routing path; and
a plurality of lead-out conductive paths disposed in locations different from the one routing path,
wherein the plurality of routing conductive paths are connected to the plurality of lead-out conductive paths via the terminal block.

6. The terminal block according to claim 1, wherein
the lower bus bar further includes a step that extends in a direction intersecting the flat portion,
the insulating middle cover includes a main body portion and a stepped portion, the main body portion covering the flat portion of the lower bus bar, and
the stepped portion of the middle cover extends in a direction intersecting the main body portion and covers the step of the lower bus bar.

7. The terminal block according to claim 1, further comprising an insulating outer cover positioned such that the upper bus bar is interposed between the middle cover and the outer cover in the overlapping direction and no bus bar is provided on a side of the outer cover not facing the upper bus bar,
wherein at least a portion of the flat portion of the lower bus bar is not covered by the outer cover when viewed in the overlapping direction.

8. The terminal block according to claim 7, wherein the non-overlap portion of the flat portion of the lower bus bar is not covered by the outer cover.

9. The terminal block according to claim 1, wherein
the upper bus bar includes a flat portion that extends in parallel to the flat portion of the lower bus bar, and a step that extends in a direction intersecting the flat portion of the upper bus bar, the flat portion of the upper bus bar including the overlap portion that overlaps the overlap portion of the lower bus bar,
the terminal block further comprising an insulating outer cover including a main body portion and a stepped portion, the main body portion covering the flat portion of the upper bus bar, and the stepped portion of the outer cover extends in a direction intersecting the main body portion of the outer cover and covers the step of the upper bus bar.

10. The terminal block according to claim 1, wherein the middle cover covers the entire flat portion of the lower bus bar.

\* \* \* \* \*